(12) United States Patent
Norte

(10) Patent No.: US 8,560,296 B2
(45) Date of Patent: Oct. 15, 2013

(54) PRINTED CIRCUIT BOARD VIA MODEL DESIGN FOR HIGH FREQUENCY PERFORMANCE

(75) Inventor: Andrew D. Norte, Westminster, CO (US)

(73) Assignee: Ricoh Production Print Solutions, Boulder, CO (US)

( * ) Notice: Subject to any disclaimer, the term of this patent is extended or adjusted under 35 U.S.C. 154(b) by 326 days.

(21) Appl. No.: 13/031,789

(22) Filed: Feb. 22, 2011

(65) Prior Publication Data

US 2012/0215515 A1 Aug. 23, 2012

(51) Int. Cl.
*G06F 17/50* (2006.01)
(52) U.S. Cl.
USPC .......................................................... 703/14
(58) Field of Classification Search
USPC .................................................. 703/14; 70/14
See application file for complete search history.

(56) References Cited

U.S. PATENT DOCUMENTS

| | | | |
|---|---|---|---|
| 6,652,318 B1 | 11/2003 | Winnings et al. | |
| 7,047,628 B2 | 5/2006 | Lee | |
| 7,249,337 B2 | 7/2007 | Gisin et al. | |
| 7,336,502 B1 | 2/2008 | Goergen | |
| 7,545,233 B2 | 6/2009 | Lin et al. | |
| 2007/0018751 A1 | 1/2007 | Hsu et al. | |
| 2007/0091581 A1 | 4/2007 | Gisin et al. | |
| 2007/0130555 A1 | 6/2007 | Osaka | |

OTHER PUBLICATIONS

Shlepnev, "Building advanced via-hole models for analysis of PCB interconnects", Simberian, Oct. 24, 2007.*
LaMeres, "Characterization of a Printed Circuit Board Via", B.S.E.E., Montana State University, 1998.*
Rimolo-Donadio, "Physics-Based Via and Trace Models for Efficient Link Simulation on Multilayer Structures Up to 40 GHz", IEEE Transactions on Microwave Theory and Techniques, vol. 57, No. 8, Aug. 2009.*

* cited by examiner

*Primary Examiner* — David Silver
(74) *Attorney, Agent, or Firm* — Duft, Bornsen, Fettig LLP

(57) ABSTRACT

Methods herein provide for estimating a high frequency performance of a PCB via model through simulation. A via model is generated to include a representation of structures of a via, such as input and output pads, and input and output stubs. A signal path in the model is defined from an input pad of the model to an output pad of the model along a transmission line segment between the input pad and the output pad. Frequency dependent input impedance values at the input pad are generated based on one or more of the input pad diameter value, the output pad diameter value, the input stub length value, and the output sub length value. A high frequency performance of the via model is estimated based on the frequency dependent input impedance values at the input pad.

18 Claims, 25 Drawing Sheets

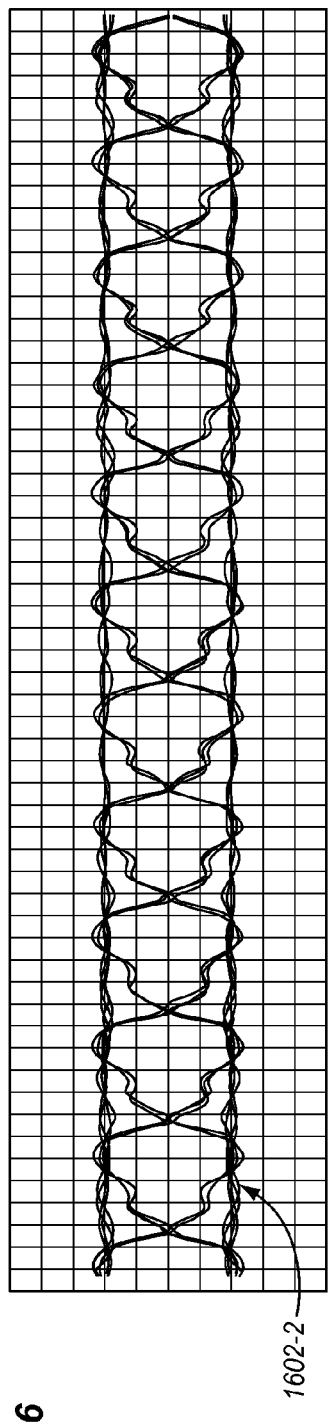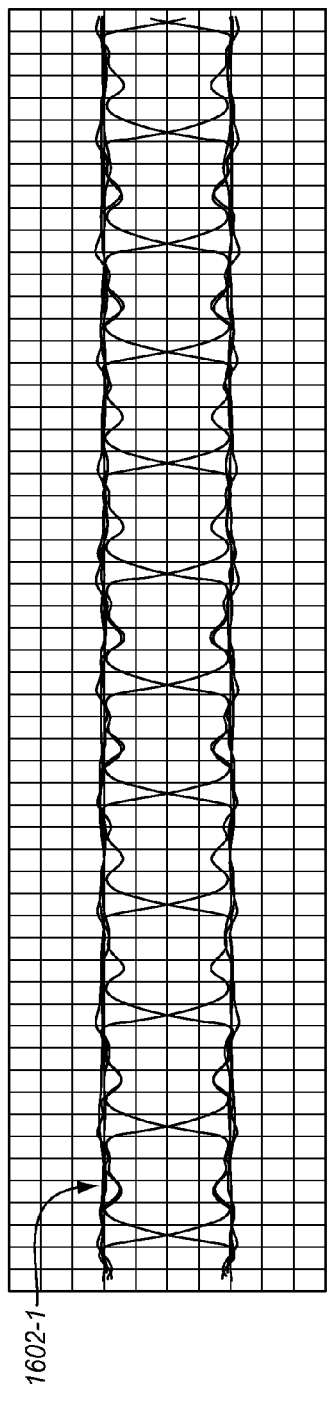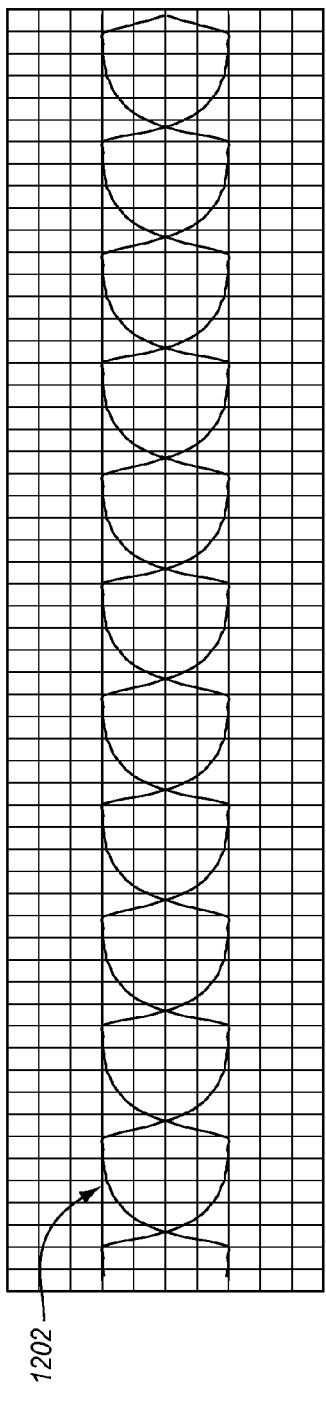
FIG. 16

PRINTED CIRCUIT BOARD VIA MODEL DESIGN FOR HIGH FREQUENCY PERFORMANCE

FIELD OF THE INVENTION

The invention relates to the field of Printed Circuit Board (PCB) via design and, in particular, to modeling the high frequency performance of PCB vias.

BACKGROUND

When transmitting high speed signals across a PCB (e.g., multi-gigabit per second signals), the signals are typically routed as differential signals. In differential signaling, two complimentary signals are transmitted along two conductive paths, forming a differential pair. The signals are typically at opposite reference voltages such that as one signal voltage transitions from state 1 to state 2, the other signal voltage transitions from state 2 to state 1. Differential signals are less sensitive to various types of noise present in a PCB because a difference between the two signals is used to encode the information instead of an absolute voltage of the signals. Often, differential signals are routed between different signal layers on a PCB. A PCB may have signal layers on the outer layers where electronic components are mounted, and on inner layers of the PCB. For example, a 10 layer PCB has 2 outer layers and has 8 inner layers. When a PCB designer elects to route signals from one layer to another layer (e.g., from a first signal layer to a second signal layer), a "via" is used. A via is a conductive PCB structure that spans the transition space between the two signal layers. When routing a differential signal through a pair of vias, the two vias are referred to as differential vias. When forming a via on a PCB, a drilling process is first used to generate a hole between the two layers. A deposition process is then performed (e.g., plating) within the hole to form a conductive path (i.e., a barrel) between the first signal layer and the second signal layer. Pads are then fabricated on each end of the via barrel spanning the two signal layers. The pads allow the signals to transition between the layers of the PCB. In some cases, the via will span a conductive plane within the PCB. For example, when the via spans a layer used as a ground plane or a power plane, the plane will include a non-conductive spacing between the plane and the barrel of the via. Without the spacing, the via would electrically short to the plane. This spacing is called the anti-pad for the via, and is part of the design process used to define the via.

In order to save cost, PCB fabricators will often drill a hole through the PCB from one component layer to the other, and plate the hole. In this case, the signal layers being routed may be deep within the PCB on the inner layers, while the ends of the via near the component layers may be unconnected. The unconnected ends of the via are called "stubs," because they typically protrude beyond the desired signal path. Stubs are problematic for PCB designers when high speed signals are routed along the via because the stubs may couple electrically to components mounted to the component layers of the PCB or other vias proximate to the stubs. In order to reduce the coupling, PCB fabricators may drill into the PCB along the via to remove the stubs. However, this increases the fabrication costs and may also damage the via internally when the drill penetrates too far into the PCB.

When high speed differential signals are routed on conductive traces of the PCB, the conductive traces act like differential transmission lines. In this case, PCB fabricators and designers take care in designing the traces to have a characteristic differential impedance that remains constant across the PCB. A typical value of the characteristic differential impedance is one hundred ohms, for example. This impedance control may be accomplished by controlling a width of the conductive traces and a distance between the two conductive traces. It remains important that the characteristic differential impedance remains relatively the same when the differential signal encounters the differential vias. If the input dynamic differential impedance of the differential vias varies with respect to the characteristic differential impedance of the conductive traces at high frequencies, then the differential signals are distorted as they traverse the differential vias, resulting in an output differential signal from the two output vias that is different from the input differential signal to the two input vias. Therefore, it is important to understand how vias affect the signals they carry in the PCB.

SUMMARY

Embodiments described herein provide methods for estimating a high frequency performance of a PCB via model through simulation. A via model is generated to include a representation of structures of a via, such as input and output pads, and input and output stubs. A signal path in the model is defined from an input pad of the model to an output pad of the model along a transmission line segment between the input pad and the output pad. Frequency dependent input impedance values at the input pad are generated based on one or more of the input pad diameter value, the output pad diameter value, the input stub length value, and the output sub length value. A high frequency performance of the via model is estimated based on the frequency dependent input impedance values at the input pad.

One embodiment comprises a method of estimating a high frequency performance of a PCB via model. A via model is generated to include a representation of an input pad coupled with an input stub, an output pad coupled with an output stub, and a transmission line segment coupled with the input pad and the output pad. In the model, the input pad has an input pad diameter value and the input stub has an input stub length value. The output pad has an output pad diameter value and the output stub has an output stub length value. A signal path in the model is defined from the input pad to the output pad along the transmission line segment. Frequency dependent input impedance values at the input pad are generated based on one or more of the input pad diameter value, the output pad diameter value, the input stub length value, and the output stub length value. A high frequency performance of the via model is estimated based on the frequency dependent input impedance values at the input pad.

Other exemplary embodiments may be described below.

DESCRIPTION OF THE DRAWINGS

Some embodiments of the present invention are now described, by way of example only, and with reference to the accompanying drawings. The same reference number represents the same element or the same type of element on all drawings.

FIGS. 12-17 illustrate the resulting output eye patterns from the simulations in exemplary embodiments.

DESCRIPTION OF THE EMBODIMENTS

The figures and the following description illustrate specific exemplary embodiments of the invention. It will thus be appreciated that those skilled in the art will be able to devise various arrangements that, although not explicitly described or shown herein, embody the principles of the invention and are included within the scope of the invention. Furthermore, any examples described herein are intended to aid in understanding the principles of the invention, and are to be construed as being without limitation to such specifically recited examples and conditions. As a result, the invention is not limited to the specific embodiments or examples described below, but by the claims and their equivalents.

Figure 1:
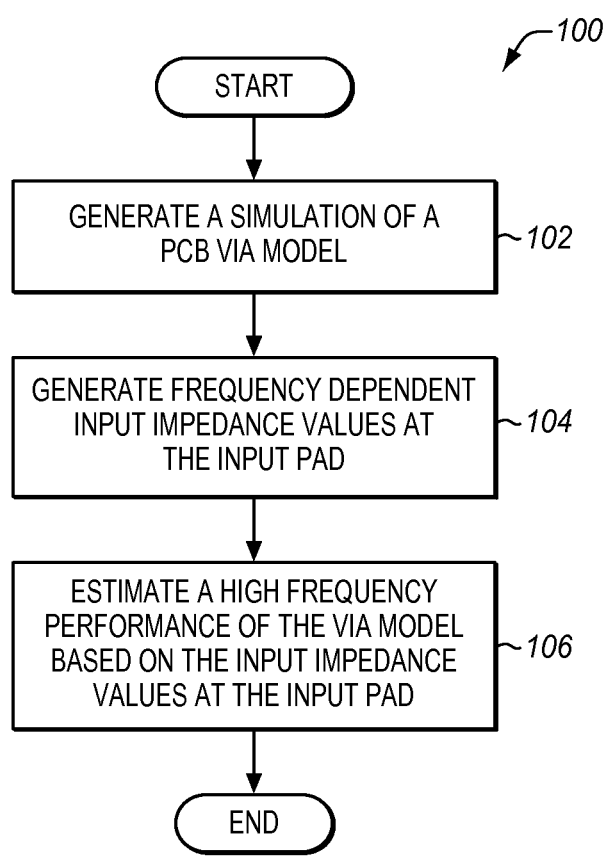
FIG. 1 is a flow chart illustrating a method of estimating a high frequency performance of a PCB via model in an exemplary embodiment.

FIG. 1 is a flow chart illustrating a method 100 of estimating a high frequency performance of a PCB via model in an exemplary embodiment. The steps of method 100 will be described with respect to via model 200 of FIG. 2, although one skilled in the art will recognize that method 100 may be applied to other via models not shown. The steps of the flow charts described herein are not all inclusive and may include other steps not shown. The steps may also be performed in an alternative order.

Figure 2:
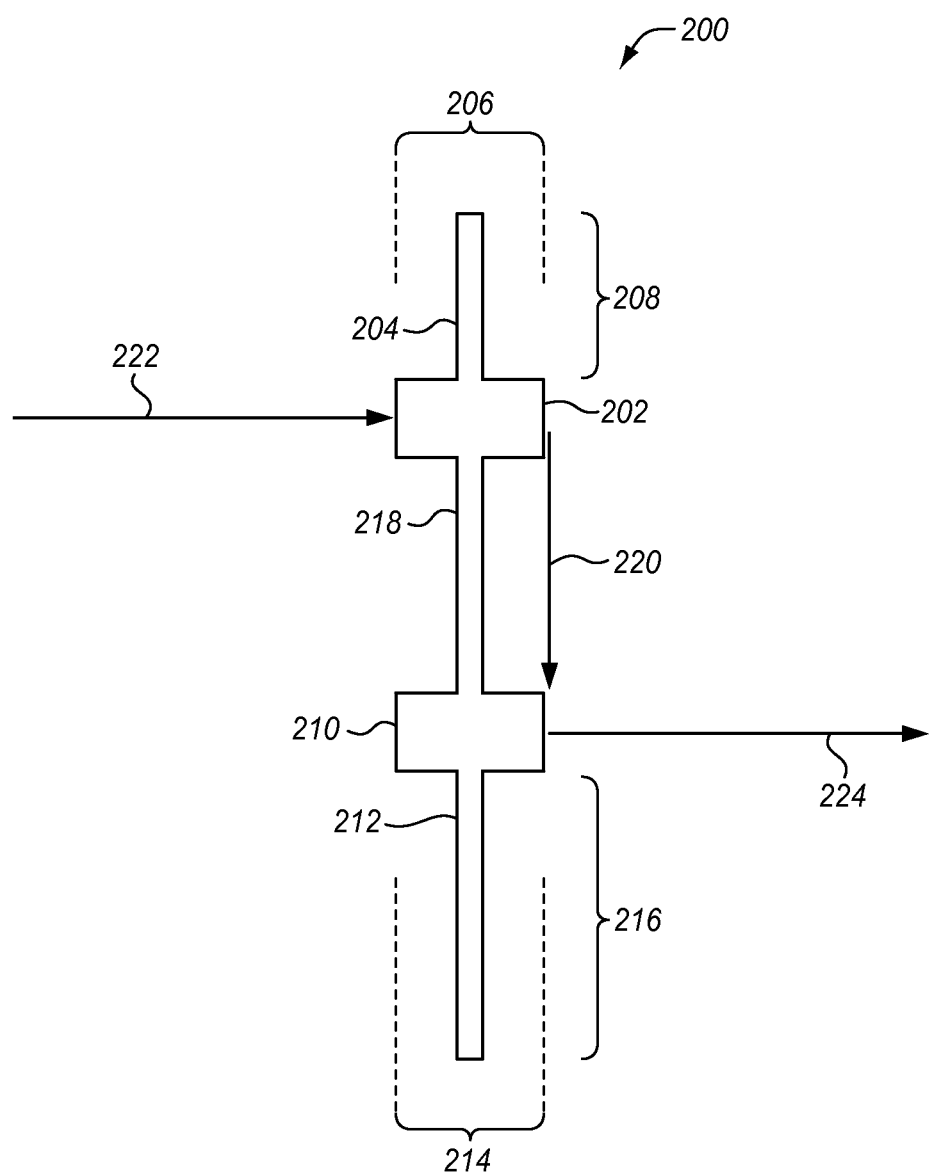
FIG. 2 illustrates a PCB via model generated by a step of the method of FIG. 1 in an exemplary embodiment.

Step 102 of method 100 comprises generating a simulation model of a PCB via model by representing various features of a via. FIG. 2 illustrates a PCB via model 200 generated by step 102 in an exemplary embodiment. Via model 200 comprises an input pad 202, an output pad 210, and a transmission line segment 218 coupled with input pad 202 and output pad 210. Ultimately, via model 200 is used during a simulation to estimate the high frequency performance of via model 200.

Using the estimate, via model 200 may allow a PCB fabricator to modify vias fabricated in physical PCB's based on via model 200 to improve the high frequency performance of the PCB's.

Input pad 202 of via model 200 has an input pad diameter 206 represented as a value in via model 200. Input pad 202 represents a pad structure for connecting a simulated input signal 222 to via model 200 for simulation purposes. Output pad 210 has an output pad diameter 214 represented as a value in via model 200. Output pad 210 represents a pad structure for outputting an output signal 224 to via model 200 for simulation purposes.

Coupled with input pad 202 is an input stub 204. Input stub 204 has an input stub length 208 represented as a value in via model 200. Coupled with output pad 210 is an output stub 212. Output stub 212 has an output stub length 216 represented as a value in via model 200. Although not shown in via model 200, pads may be present at the terminating ends of input stub 204 and output stub 212. Along transmission line segment 218, a signal path 220 is defined from input pad 202 to output pad 210. Generally, simulated input signal 222 enters input pad 202, traverses along signal path 220, and exits output pad 210 as a simulated output signal 224.

Step 104 of method 100 (see FIG. 1) comprises generating frequency dependent input impedance values at input pad 202. When an input impedance varies based on frequency, different frequency components of the input signal will "see" different impedances. For example, the frequency components of a square wave will include the fundamental frequency of the square wave and odd-harmonics of the fundamental frequency. In the example, the odd harmonics "see" different impedances than the fundamental frequency, which affects the frequency components differently. The input dynamic impedance, as a function of frequency, can be determined through the use of lumped circuit analysis principles, such as Laplace Transforms, and linear circuit analyses techniques. The input dynamic impedance referenced at input pad 202 may be determined by combining the various contributors to this impedance in series and parallel combinations, until a single overall impedance is determined at the location of input pad 202. In essence, this input dynamic impedance is the Thevenin equivalent impedance with respect to input pad 202, and in the direction of the signal propagation.

Step 106 comprises estimating a high frequency performance of via model 200 based on the frequency dependent input impedance values calculated in step 104. When the frequency dependent input impedance values at input pad 202 vary, the different frequency components of an input signal (e.g., input signal 222), are affected differently depending on the frequency components. In continuing with our example, the odd-harmonics of the fundamental frequency of the square wave may be attenuated or amplified as compared to the fundamental frequency. This may cause rounding or ringing at output 224 where the square wave transitions from one voltage state to another. For example, the frequency dependent input dynamic impedance may be comprised of a nearly constant value at low frequencies, followed by either dips or peaks that are below or above the nearly constant value at low frequencies. These dips or peaks may cause either attenuation or amplification, respectively, of the input frequencies from the input signal.

Figure 3:
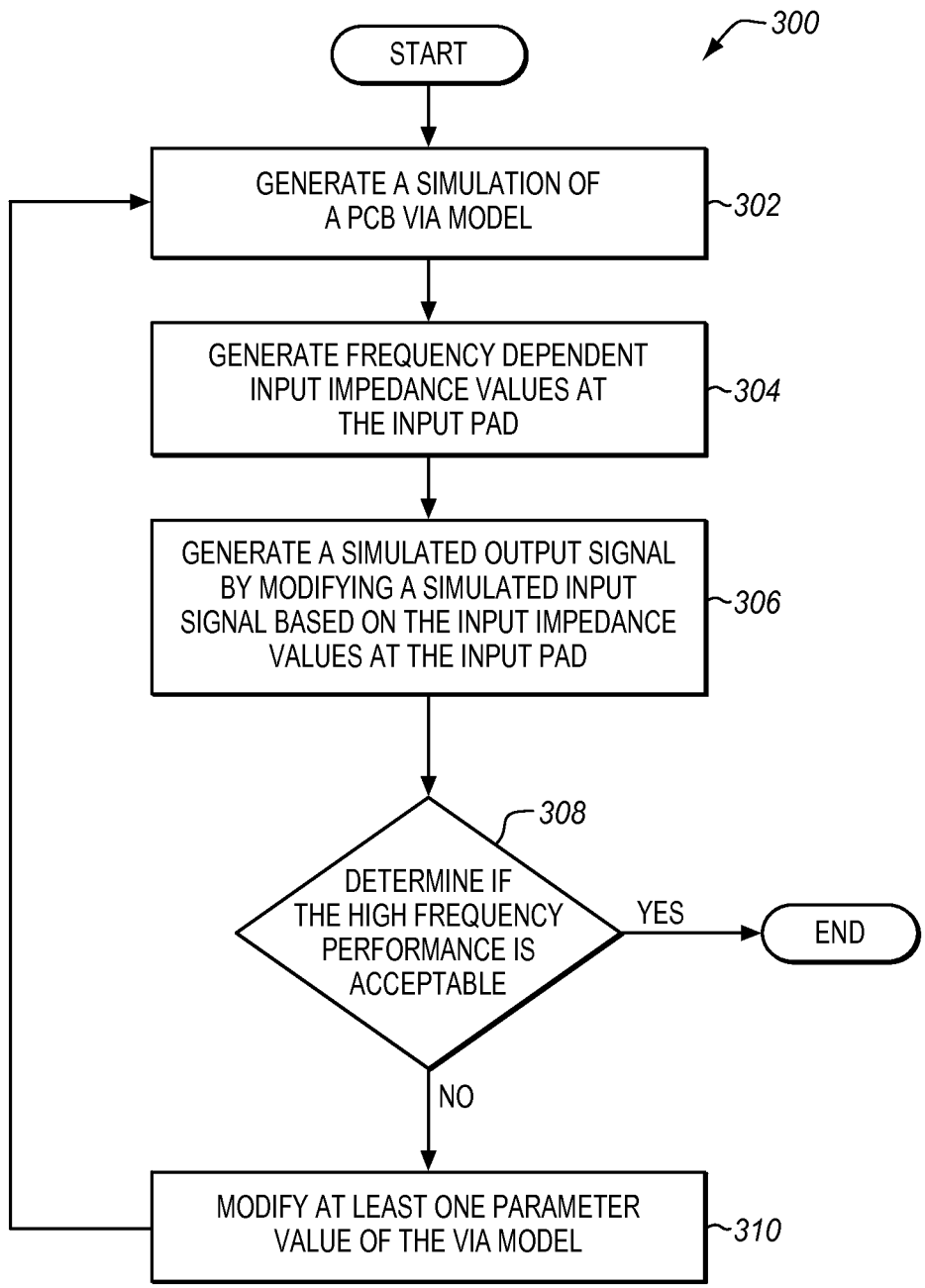
FIG. 3 is a flow chart illustrating another method of estimating a high frequency performance of a PCB via model in an exemplary embodiment.

FIG. 3 is a flow chart illustrating another method 300 of estimating a high frequency performance of a PCB via model in an exemplary embodiment. The steps of method 300 will be described with respect to via model 400 of FIG. 4, although one skilled in the art will recognize that method 300 may be applied to other via models not shown. Method 300 differs from method 100 in that simulated input signals and output signals are used to determine a high frequency performance for via model 400. If the high frequency performance is not acceptable, then one or more parameters of via model 400 are adjusted and the model is re-generated for additional simulation.

Figure 4:
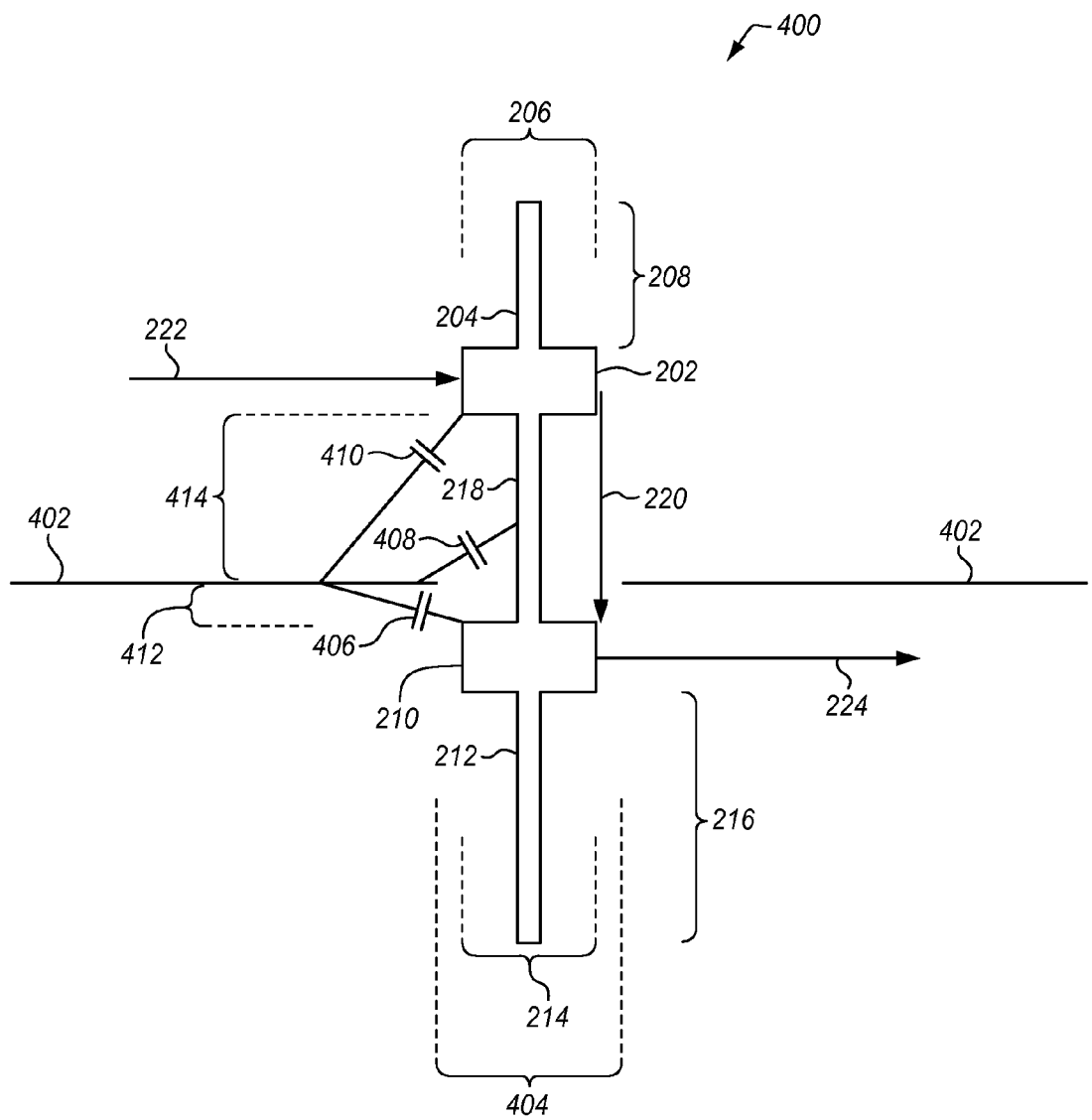
FIG. 4 illustrates a PCB via model generated by a step of the method of FIG. 3 in an exemplary embodiment.

Step 302 comprises generating a simulation of a PCB via model. FIG. 4 illustrates a PCB via model 400 generated by step 302 of method 300 in an exemplary embodiment. Although only one via is shown in FIG. 4, two instances of via model 400 may be used when differential signaling is simulated. As discussed in the background, routing high speed signals on a PCB may involve the use of two vias, one pair of vias for each of the differential signals. When simulating two instances of via model 400 for differential signaling, additional impedance couplings between the two instances may be present. For example, pads (not shown in via model 400) along the terminating ends of stubs 204 and 212 may couple to the corresponding instance of via model 400, altering the impedance values calculated.

Via model 400 includes the previously described features for via model 200, with the addition of a conductive reference plane 402 between the input pad 202 and output pad 210. Reference plane 402 may be a ground plane or a power plane. A ground plane represents a reference ground (e.g., 0V) for a PCB. A power plane represents a reference power plane (e.g., 5V, 3.3V, 1.2V, etc.) for a PCB. Where transmission line segment 218 crosses reference plane 402 in via model 400, a non-conductive spacing defines an anti-pad diameter 404 around transmission line segment 218. Anti-pad diameter 404 represents a spacing between reference plane 402 and transmission line segment 218 and is used to prevent shorts between transmission line segment 218 and reference plane 402 in physical vias. Anti-pad diameter 404 is represented as a value in via model 400.

When reference plane 402 is present, a capacitive coupling is represented in via model 400 between the various features of via model 400. Capacitance 406 represents a capacitive coupling between output pad 210 and reference plane 402, and is based in part on a distance 412 between output pad 210 and reference plane 402. Capacitance 408 represents a capacitive coupling between transmission line segment 218 and reference plane 402, and is based in part on a varying distance along transmission line segment 218 and reference plane 402.

Capacitance 410 represents a capacitive coupling between input pad 202 and reference plane 402, and is based in part on a distance 414 between input pad 202 and reference plane 402. In model 400, capacitance 406, 408, and 410 will be used when calculating the frequency dependent impedance values at input pad 202, in addition to input pad diameter 206, output pad diameter 214, input stub length 208, output stub length 216, and anti-pad diameter 404. The frequency dependent input impedance values at input pad 202 may also be based on a characteristic impedance of transmission line segment 218 and/or physical characteristics of a PCB model for via model 400.

For example, calculating a capacitance for input pad 202 and output pad 210 may be based on the following equation:

$$C_{pad} = \frac{-4\pi\varepsilon\left(\frac{D_1}{2}\right)\left\{\left(\frac{D_1}{2}\right)^2 + \left[h^2 + \left(\frac{D_2 - D_1}{2}\right)^2\right]\right\}^{1/2}}{\left(\frac{D_1}{2}\right) - \left[\left(\frac{D_1}{2}\right)^2 + \left[h^2 + \left(\frac{D_2 - D_1}{2}\right)^2\right]\right]^{1/2}} \text{ Farads}$$

where $D_1$ is input pad diameter 206 or output pad diameter 214 when calculating capacitance 410 and 406, respectively, $D_2$ is anti-pad diameter 404, and h is a distance (e.g., distance 414 or 412, respectively) between the pads and reference plane 402.

Step 304 of method 300 comprises generating frequency dependent input impedance values at input pad 202 based on one or more of input pad diameter 206, output pad diameter 214, input stub length 208, and output stub length 216. Additionally, generating the impedance values is based on anti-pad diameter 404 and capacitances 406, 408, and 410.

Figure 5:
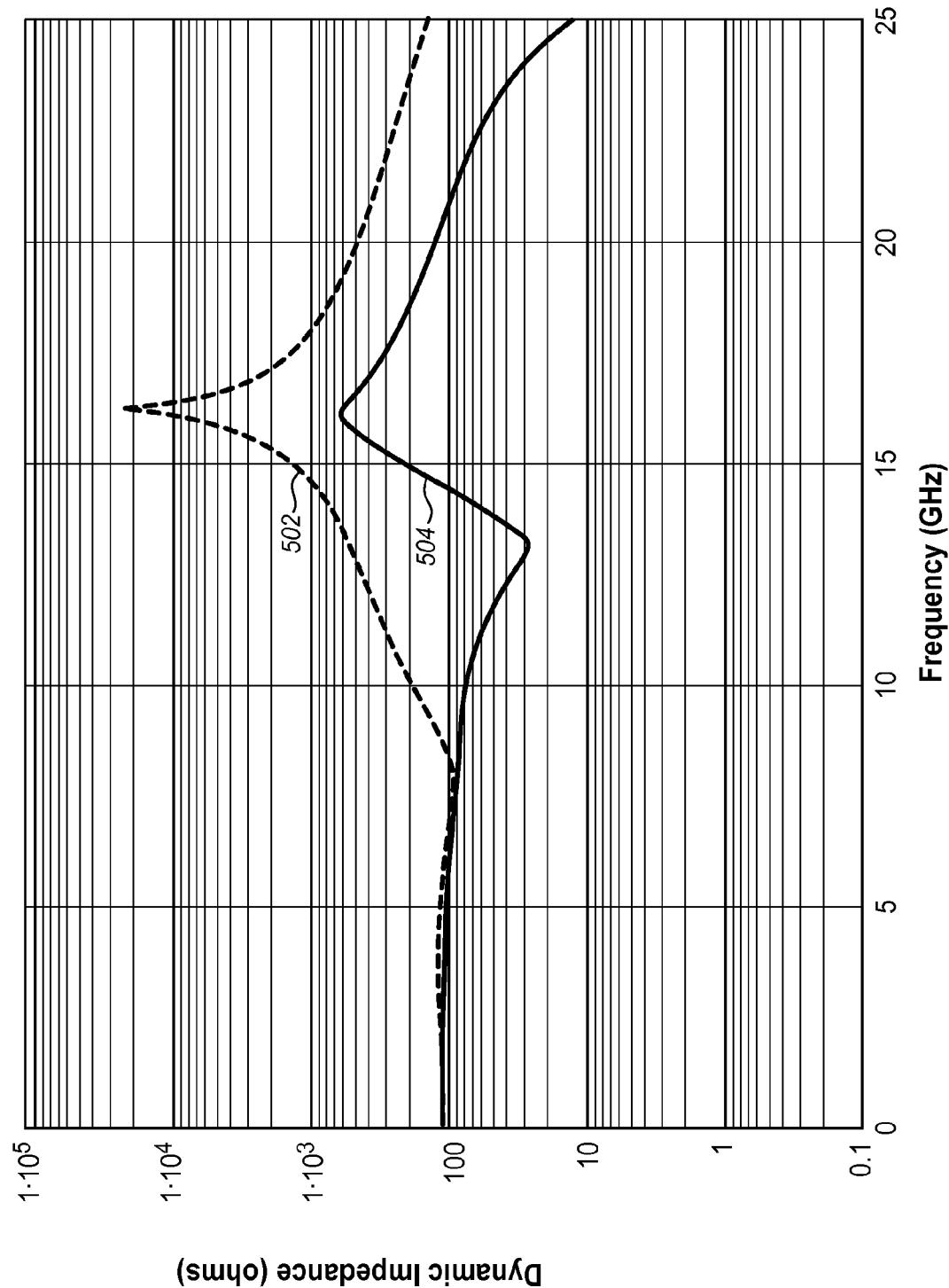
FIG. 5 illustrates two input impedance plots for the via model of FIG. 4 in an exemplary embodiment.

FIG. 5 illustrates two input impedance plots 502 and 504 for via model 400 of FIG. 4 in an exemplary embodiment. Plot 502 represents an example of frequency dependent input impedance values when reference plane 402 is a power plane. Plot 504 represents an example of frequency dependent input impedance values when reference plane 402 is a ground plane. Note that for plot 502 the impedance increases from about one hundred ohms at zero hertz to about twenty thousand ohms at about sixteen Gigahertz. Also note that for plot 504 the impedance drops from about one hundred ohms at zero hertz to about twenty ohms at about thirteen Gigahertz. The variation in impedance shown in plots 502 and 504 will affect different frequency components of an input signal, such as input signal 222.

Step 306 comprises generating simulated output signal 224 by modifying simulated input signal 222 based on the frequency dependent impedance values calculated in step 306. Linear circuit theory teaches that an output signal from a linear circuit is the convolution of the input signal with the circuit's impulse response. This convolution is in the form of an integral, and can be found in most linear circuits textbooks. Here it is for your reference:

$$V_{out}(t) = \int_{-\infty}^{\infty} V_{in}(t - \lambda)h(\lambda)\,d\lambda$$

The quantity, $h(\lambda)$ is the impulse response of the circuit.

Figure 6:
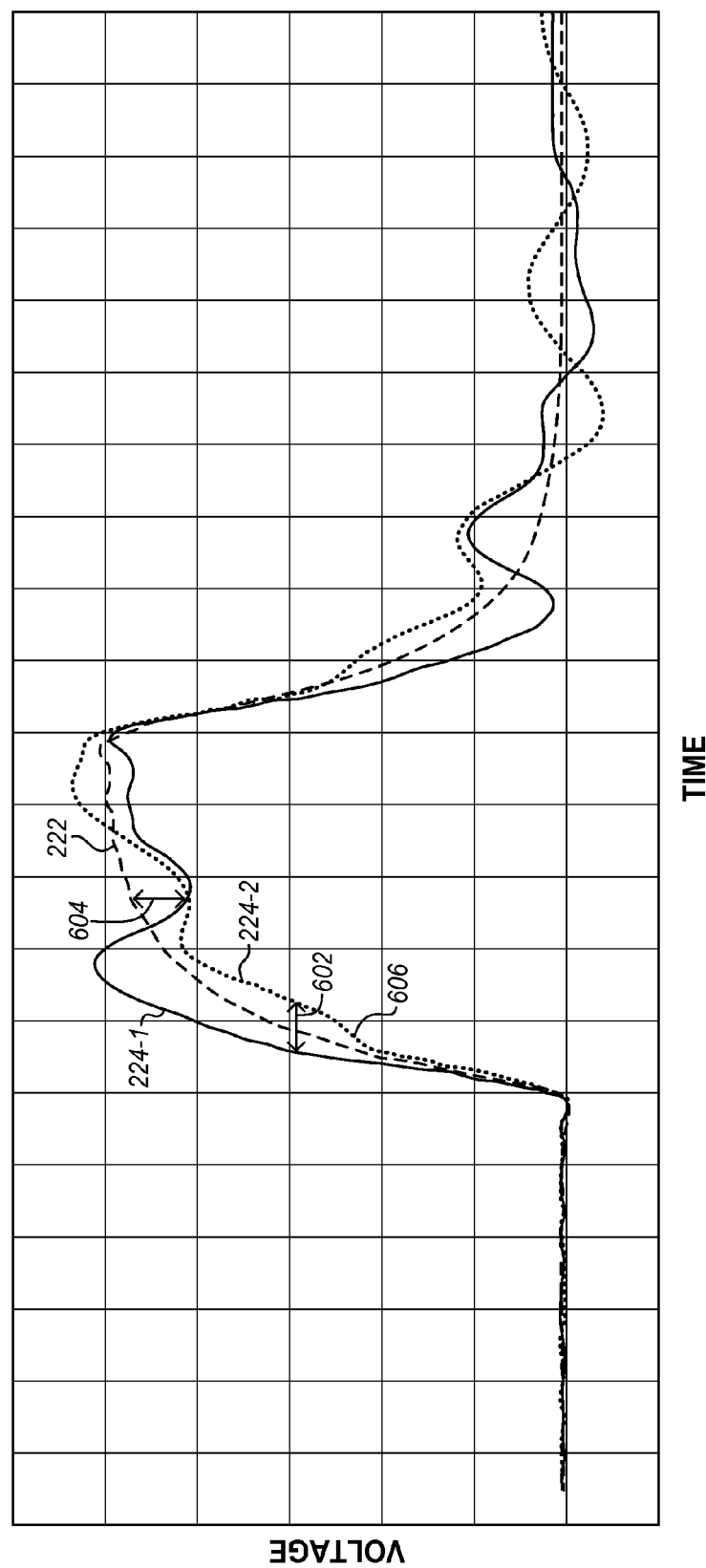
FIG. 6 illustrates a simulated input signal and two simulated output signals in an exemplary embodiment.

FIG. 6 illustrates simulated input signal 222 and two simulated output signals 224-1 and 224-2 in an exemplary embodiment. Simulated output signal 224-1 is the result of simulating via model 400 when reference plane 402 is a power plane. Simulated output signal 224-2 is the result of simulating via model 400 when reference plane 402 is a ground plane. Note that there are differences between input signal 222 and output signals 224-1 and 224-2. For example, output signals 224-1 and 224-2 have a significant undershoot 604 along a flat top portion of input signal 222. Further, output signals 224-1 and 224-2 exhibit a phase shift 602 as compared to input signal 222. In addition, output signal 224-2 exhibits a rise time lag 606 as compared to input signal 222. These types of signal distortions associated with output signals 224-1 and 224-2 will be discussed in more detail below.

Step 308 comprises determining if the high frequency performance is acceptable when differences between input signal 222 and output signal 224 exceed a threshold. Differences that may be evaluated include an undershoot 604, rise time 606 (rise time lag, associated with output signal 224-2), a timing jitter, an overshoot, a phase shift 602 between output signals, etc. When output signals 224-1 and 224-2 are distorted based on phase shift 602, output signal 224 may exhibit smaller risetimes or distorted risetimes 606 when compared to input signal 222. FIG. 6 illustrates output signal 224-1 exhibiting a smaller risetime than the risetime from the input signal 222 and output signal 224-2 exhibits a distorted risetime relative to the risetime from the input signal 222. Both are a type of signal distortion associated with a phase shift. In FIG. 6, input signal 222 is shown superimposed along with output signals 224-1 and 224-2. Obviously, input signal 222 occurs first, then output signals 224-1 and 224-2 follow temporally.

When output signals 224-1 and 224-2 are distorted with respect to input signal 222 based on undershoot 604, output signals 224-1 and 224-2 drop below input signal 222. FIG. 6 shows output signals 224-1 and 224-2 below input signal 222 along a flat top portion of input signal 222, which is a type of signal distortion associated with an undershoot.

Figure 7:
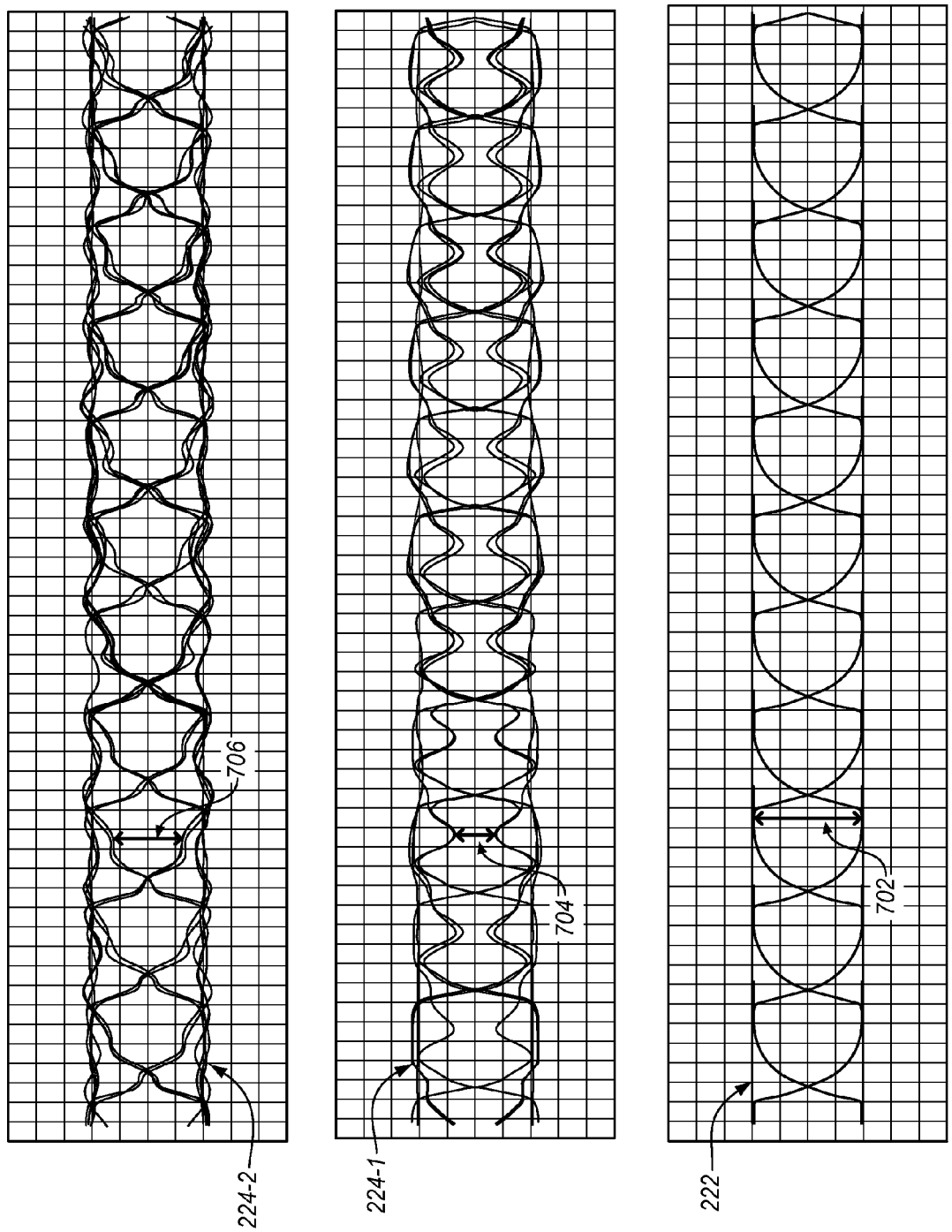
FIG. 7 illustrates an example of how noise margins of output signals may be modified due to an undershoot in an exemplary embodiment.

FIG. 7 is illustrates an example of how the noise margins of output signals 224-1 and 224-2 may be modified due to undershoot 604 in an exemplary embodiment. The noise margin is an amount by which a signal exceeds a threshold for properly determining its binary state. For example, a circuit may be designed to read a difference between two signals to determine a binary state. When the difference exceeds a voltage (e.g., four hundred millivolts), the circuit registers a binary one. When the difference is less than a voltage (e.g., two hundred millivolts), the circuit registers a binary zero. When undershoot 604 is present in differential output signals, the differences between the signals is reduced. This reduces the noise margin when the "eye openings" of the signals are small.

Bits of data are commonly represented as sequences of voltage pulses. For example, a binary 1 may be represented as a positive voltage pulse, whereas a binary 0 may be represented as a negative voltage pulse. When a sequence of binary 1's and 0's are either transmitted by a source, or received by a receiver, it is instructive to overlay the voltage pulses on top of each other. By doing so, an eye pattern is generated.

FIG. 7 illustrates a large eye opening 702 for input signal 222. Eye openings 704 and 706 for output signals 224-1 and 224-2, respectively, are smaller than for input signal 222. This "closes the eye" and reduces the noise margin. When undershoot 604 exceeds a threshold, then the high frequency performance is determined to be poor in step 310.

Figure 8:
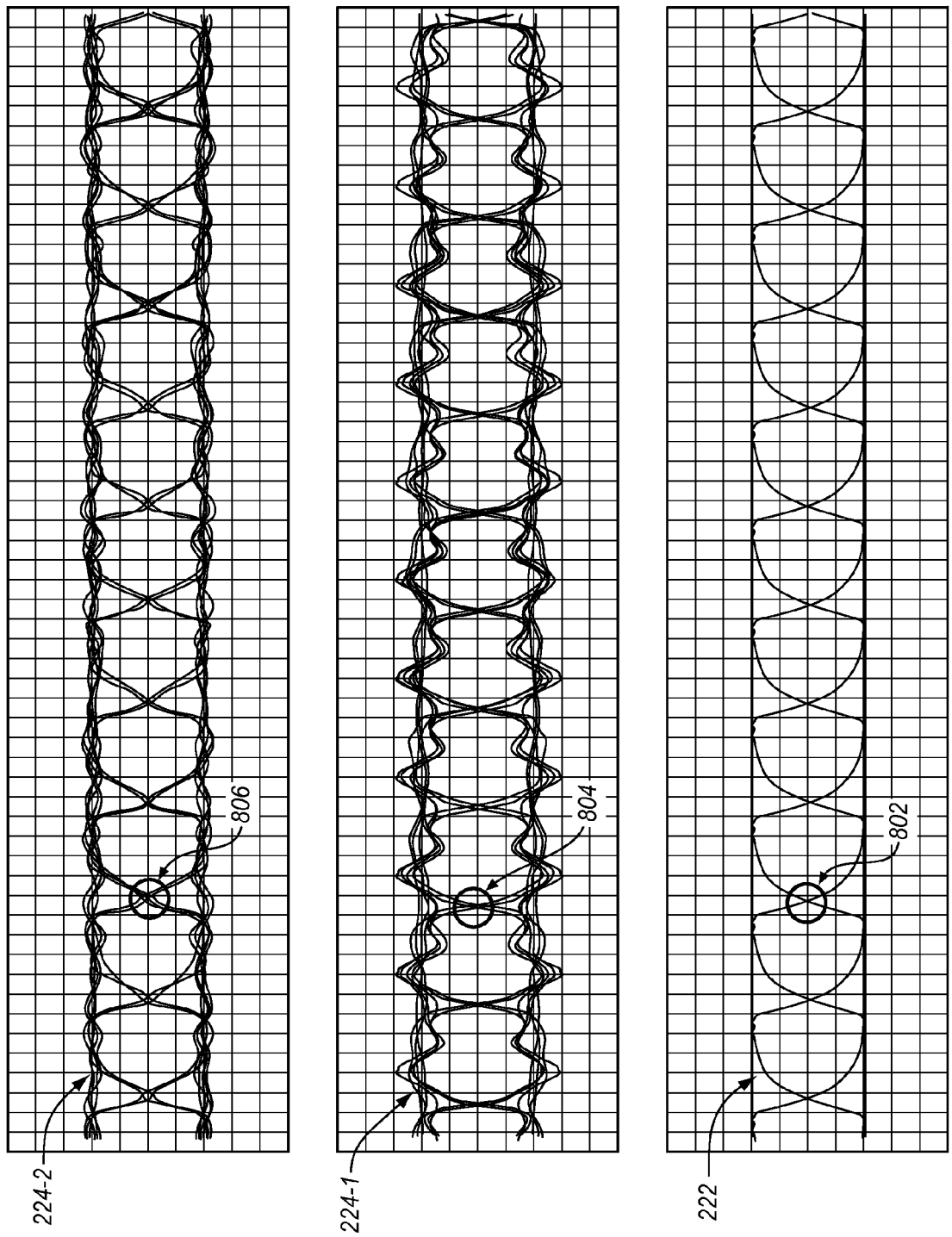
FIG. 8 illustrates an example of how a change in rise time for an output signal may affect a timing jitter in an exemplary embodiment.

When output signals 224-1 and 224-2 are distorted with respect to input signal 222 based on rise time 606, a rise time for output signals 224-1 and 224-2 differ as compared to input signal 222. FIG. 6 illustrates output signal 224-2 with a delayed rise time 606 (note that rise time 606 stalls compared to the superimposed input signal 222) as compared to simulated input signal 222, which is a type of signal distortion associated with a rise time. Poor rise times contribute to excessive timing jitter in periodic signals. Jitter may be considered as the time variation in a periodic signal at a specific point in the signal, such as a zero voltage crossing point. FIG. 8 is an example of how a change in rise time for output signal 224 may affect a timing jitter in an exemplary embodiment. A timing jitter 802 (marked as a zero voltage crossing point in this example) for input signal 222 does not vary over time. However, timing jitter 804 and 806 do vary over time.

When rise time 606 exceeds a threshold, then the high frequency performance is determined to be poor in step 308.

When the differences do not exceed a threshold, then method 300 ends. When the differences exceed a threshold, then step 310 is performed. Step 310 comprises modifying one or more parameters of via model 400. For example, one or more of input pad diameter 206, output pad diameter 214, input stub length 208, output stub length 216, and anti-pad diameter 404 may be modified for via model 400. After modifying via model 400, steps 302-306 are performed again and the high frequency performance is re-evaluated in step 308. This process may continue until the high frequency performance of via model 400 is considered to be acceptable.

Using the values for via model 400, a physical PCB via may be fabricated and tested. For example, real input signals may be applied to the fabricated via, and real output signals may be measured. Using the input and output signals applied to the fabricated via, differences between via model 400 and the fabricated via may be analyzed. This allows the fabrication operator to understand how closely via model 400 approximates the fabricated via. Via model 400 may then be adjusted based on the analysis to more closely correspond with the fabricated via during simulation.

EXAMPLES

Figure 9:
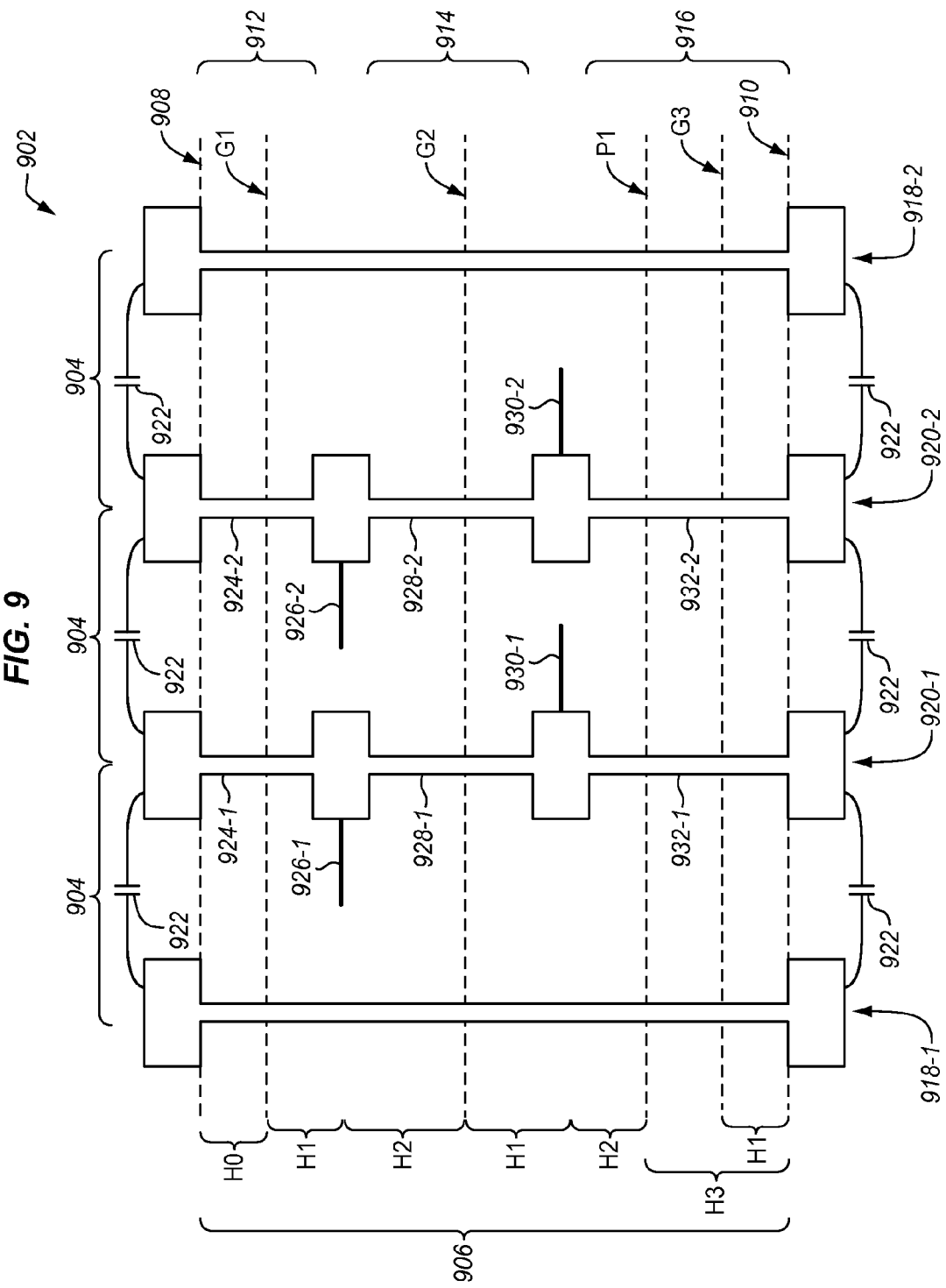
FIG. 9 illustrates a differential via model when signals cross a ground plane in an exemplary embodiment.

When routing very high-speed differential signals throughout a printed circuit board, it is common practice to route these signals through different signal layers. In order to do so, the differential signals cut through one or more reference planes through the use of differential vias. FIG. 9 illustrates differential via model 902 when signals cross a ground plane in an exemplary embodiment. In FIG. 9, a pair of differential vias 920-1 and 920-2 are modelled close to two ground vias 918-1 and 918-2. FIG. 9 illustrates the case in which a one hundred ohm differential stripline transitions between signal layers 926 and 930, crossing a ground plane G2. The input signal 926 comprises differential pair 926-1 and 926-2. The output signal 930 comprises differential pair 930-1 and 930-2. FIG. 9 also illustrates ground plane G1 between component layer 908 and signal layer 926, and ground plane G3 between component layer 910 and signal layer 930. In addition, a power plane P1 is illustrated between signal layer 930 and ground plane G3. Although not shown in FIG. 9, coupling capacitances and anti-pad diameters are modelled between the reference planes and the various features of via model 902, as discussed previously with respect to via model 400 of FIG. 4. FIG. 9 also illustrates a number of distances H0-H3 between the reference planes and different features of via model 902. For example, H0 is a distance between a component layer 908 and ground plane G1. H1 is a distance between ground plane G1 and signal layer 926, and between a component layer 910 and ground plane G3. H2 is a distance between signal layer 926 and ground plane G2, and between power plane P1 and signal layer 930. H3 is a distance between power plane P1 and component layer 910. Ground vias 918-1 and 918-2 exists close to differential vias 920-1 and 920-2 (shown by distance 904) that is intended to electrically connect to the ground planes G1-G3. Each via of differential vias 920-1 and 920-2 in via model 902 is separated from each other by distance 904, which is twenty thousandth of an inch (i.e., 20 mils) in the examples. Further, a capacitive coupling 922 between the vias of via model 902 is modelled using a value of 8 femtofarads in the examples. While it is assumed that a decoupling capacitor connects power and ground planes together in the example, ground via 918-1 is assumed to be much closer to via 920-1 in via model 902. Also, ground via 918-2 is assumed to be much closer to via 920-2. FIG. 9 also illustrates input stubs 924-1 and 924-2, and output stubs

932-1 and 932-2 associated with via model 902. A thickness 906 of the PCB is 60 mils in these examples.

Differential vias 920-1 and 920-2 are partitioned into three segments. An input stub length 912 (stub$_1$) is a length of input stubs 924-1 and 924-2, and occurs between component layer 908 and signal layer 926. A transmission line length 914 is a length of transmission line segments 928-1 and 928-2, and carries the differential signal between signal layers 926 and 930. In the examples, transmission line length 914 is 15 mils. An output stub length 916 (stub$_2$) is a length of output stubs 932-1 and 932-2. In the examples, the edge-to-edge distance (not shown in FIG. 9) between the differential conductors on signal layers 926 and 930 is 16 mils, with a conductor width (not shown in FIG. 9) equal to 4 mils. This geometry yields a one hundred ohm differential impedance along the differential stripline. Input stub length 912 takes on the values of 11 mils, 17 mils, and 22 mils, while output stub length 916 takes on the values of 34 mils, 28 mils, and 23 mils during simulation. For example, when input stub length 912 is 11 mils, then the length of output stub length 916 is 34 mils. Thus, the sum of the lengths of both stubs is equal to 45 mils. A small mutual capacitance 922, exists between the two via pads at the end of each of input and output stubs 924 and 932. For a risetime of 40 ps, which corresponds to the input risetime for the 10 Gbs propagating differential input signal on signal layer 926, the impedance due to capacitance 922 is about 1600 ohms Therefore, the load of stubs 924 and 932 behaves mostly as a high impedance load. All pad diameters in the examples are 15 mils.

Figure 10:
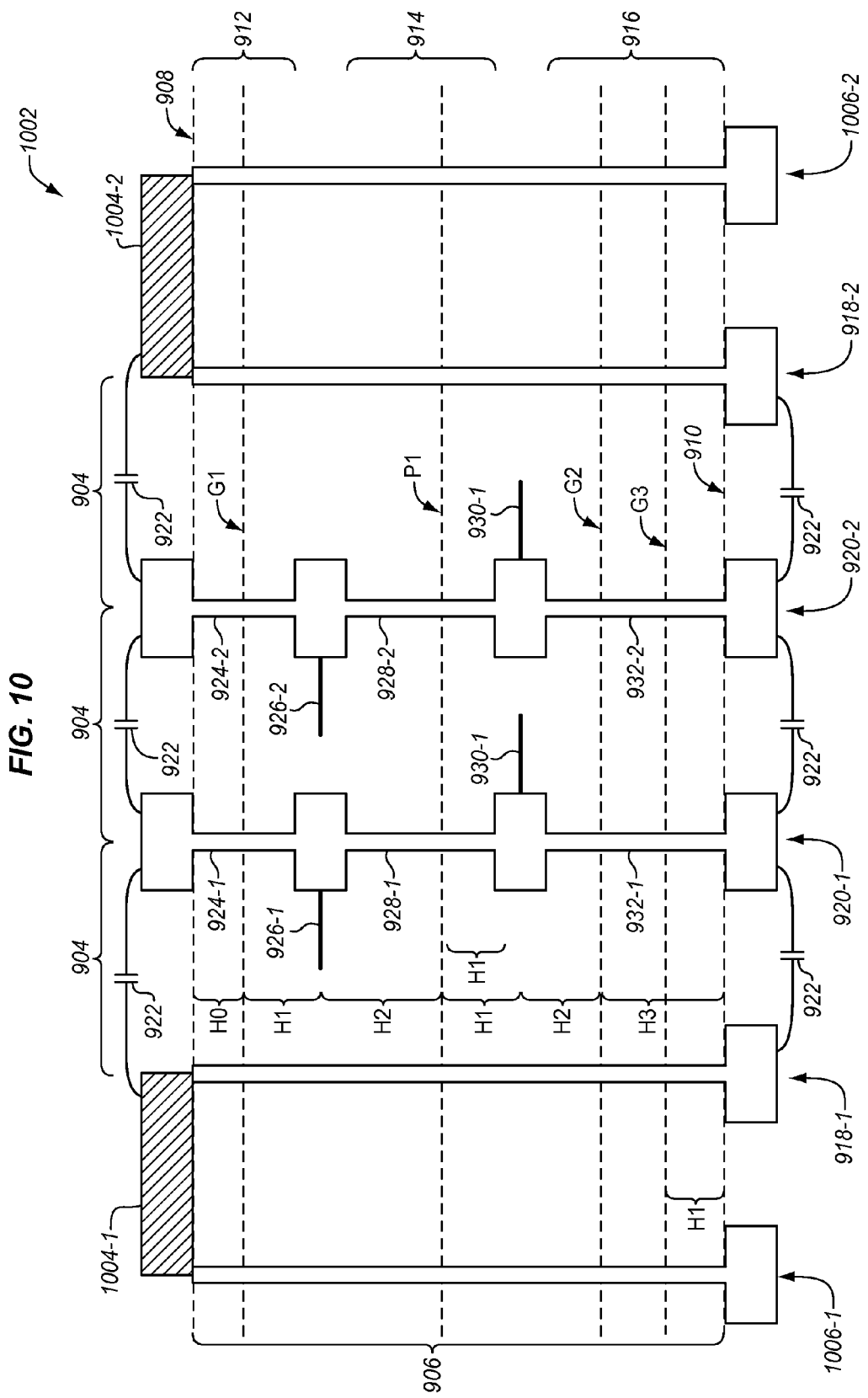
FIG. 10 illustrates a differential via model when signals cross a power plane in an exemplary embodiment.

FIG. 10 illustrates differential via model 1002 when signals cross a power plane in an exemplary embodiment. In FIG. 10, differential vias 920-1 and 920-2 are modelled close to power vias 1006-1 and 1006-2, and ground vias 918-1 and 918-2. When a power plane P1 exists between signal layers 926 and 930, then it is assumed in via model 1002 that decoupling capacitors 1004-1 and 1004-2 interconnects power plane P1 to the ground planes at high frequencies, and are located much closer to differential vias 920-1 and 920-2, respectively, in via model 1002 than the nearest ground vias that may exist elsewhere, and that are not part of the decoupling capacitor structures comprised of 918-1, 1004-1, 1006-1 or 918-2, 1004-2, and 1006-2. In either case, it is possible that ground vias 918, or decoupling capacitors 1004 may be placed physically close to the differential signal, especially in a densely routed PCB. Thus, it is of interest to understand the impact of changes to input and output stub lengths 912 and 916, as well as the nearby ground vias 918, and the nearby decoupling capacitors 1004, on the signal integrity characteristics of the propagating differential signal. These examples address the two scenarios by considering the situations in which a 10 Gbs differential stripline signal, with 40 picoseconds (ps) risetimes, propagates between two different stripline signal layers 926 and 930, and in which a ground plane or power plane exists between the two signal layers 926 and 930.

Figure 11:
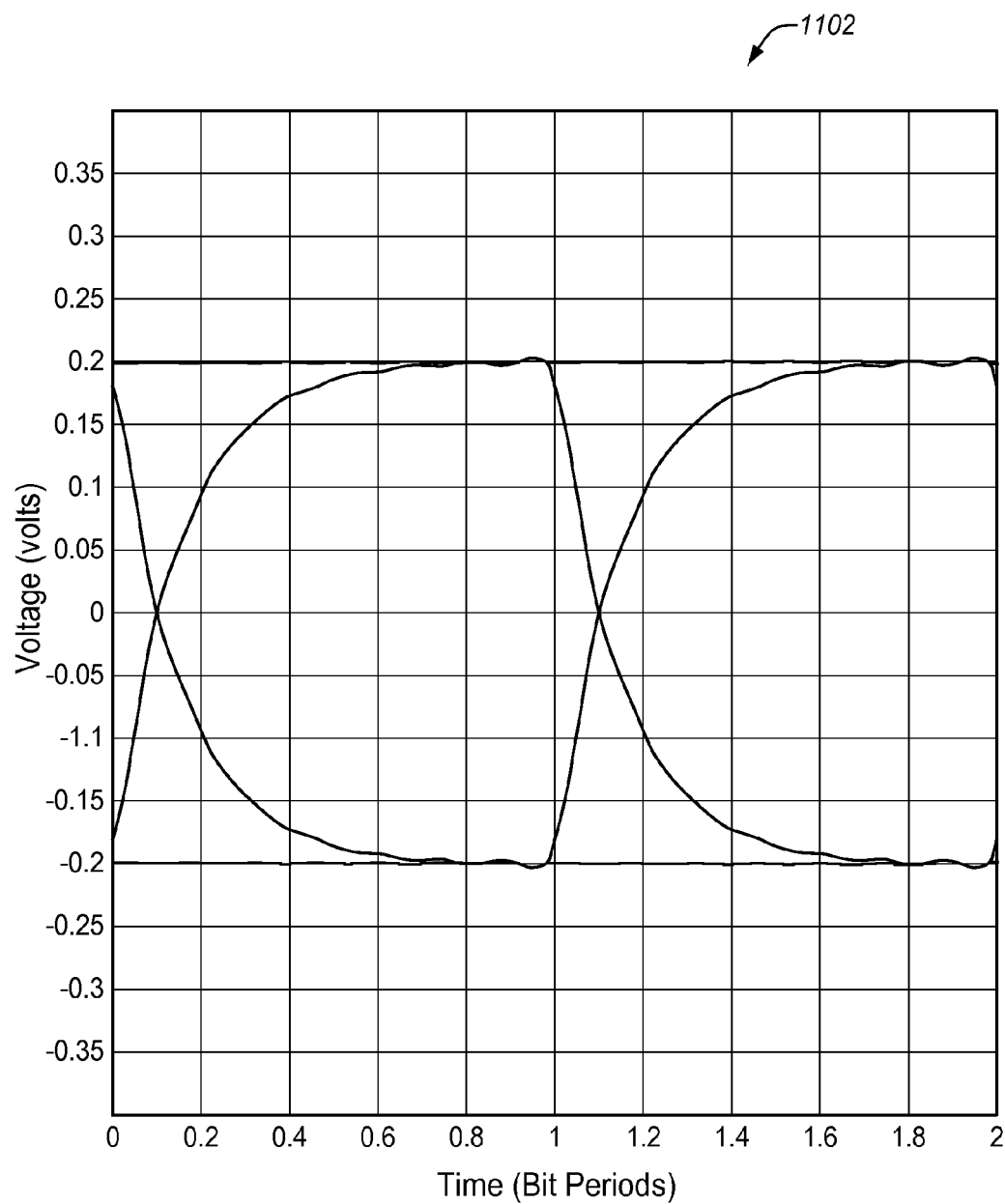
FIG. 11 illustrates the reference input eye pattern used for a simulated input signal in via models of FIGS. 9 and 10 in exemplary embodiments.
Figure 12:
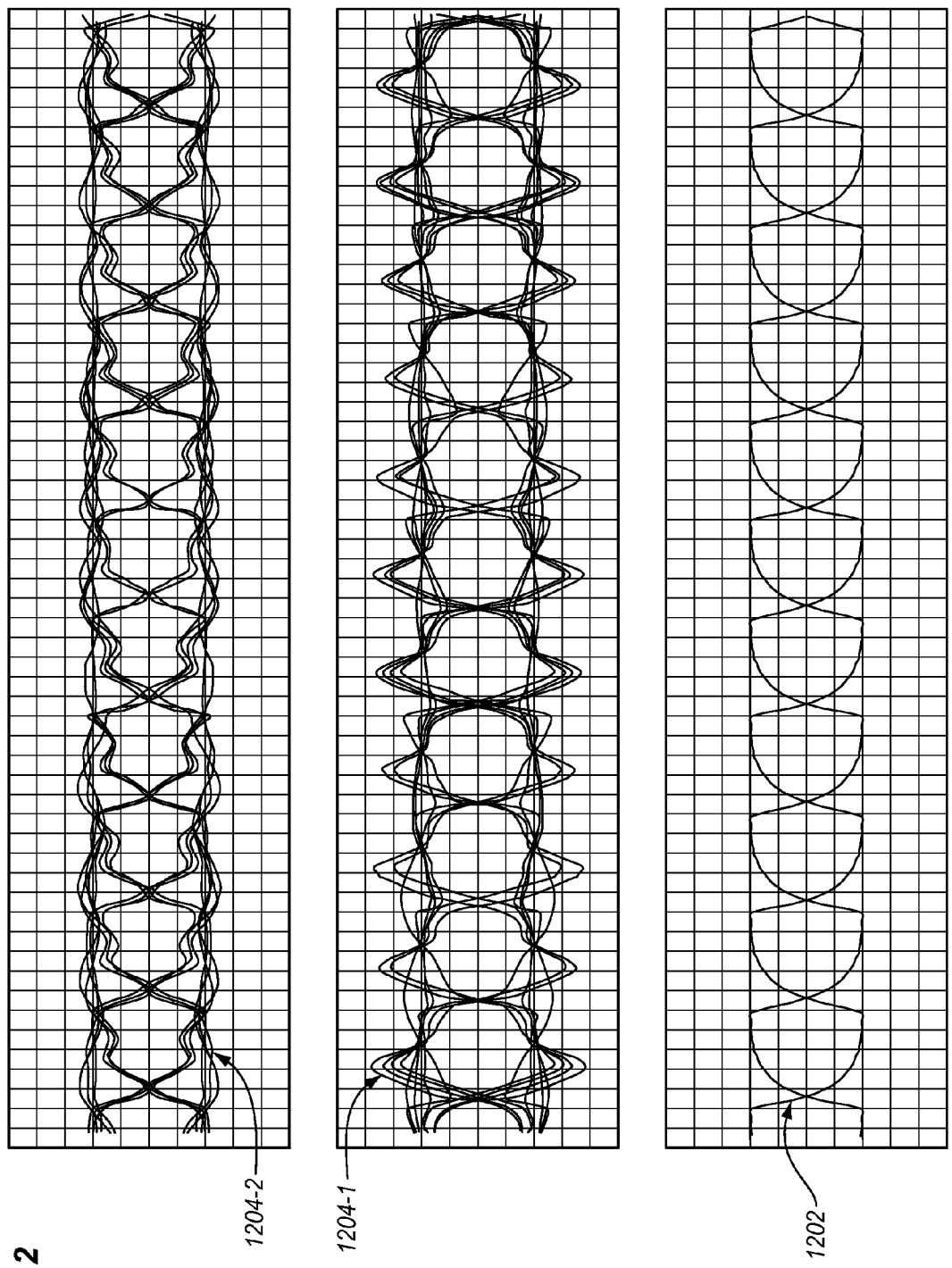

FIG. 11 illustrates the reference input 10 Gbs eye pattern 1102 used for a simulated input signal in via models 902 and 1002 in an exemplary embodiment. Eye pattern 1102 is applied to signal layer 926 as a differential signal. FIGS. 12-17 illustrate the resulting output eye patterns from the simulations in exemplary embodiments. FIG. 12 illustrates a simulation of the output differential eye patterns 1204-1 and 1204-2 for an input signal 1202 bit rate of 10 Gb/s, and with input risetimes of 40 ps. The lengths of the input and output stubs 912 and 916 are 11 mils and 34 mils, respectively, and thickness 906 of the printed circuit board is about 65 mils. One mil is equal to 0.001 inches. In addition, H0=7 mils, H1=4 mils, H2=11 mils, and H3=26 mils. The differential impedance between the two conductors on signal layers 926 or 930 is 100 ohms The pad diameters are 15 mils, and the anti-pad diameter is 40 mils. The mutual capacitance 922 is $5.6 \times 10^{-15}$ farads. The distance 904 is 20 mils. In FIG. 12, output signal 1204-2 simulates where the differential signal on signal layer 926 jumps to signal layer 930 through ground plane G2, as shown in FIG. 9. Output signal 1204-1 simulates where the differential signal on signal layer 926 jumps to signal layer 930 through power plane P1, as shown in FIG. 10. Input signal 1202 is the input differential eye pattern 1102. In this case, it is clear that output differential signals 1204-1 and 1204-2 are distorted relative to input differential signal 1202, and exhibit reduced noise margins, as well as timing jitter. For the above set of parameters, a signal jumping across a power plane produces a larger noise margin and larger timing jitter than signal jumping across a ground plane. In this situation, it is better to signal jump across a power plane because the noise margin is larger and it will negate the increased timing jitter.

Figure 13:
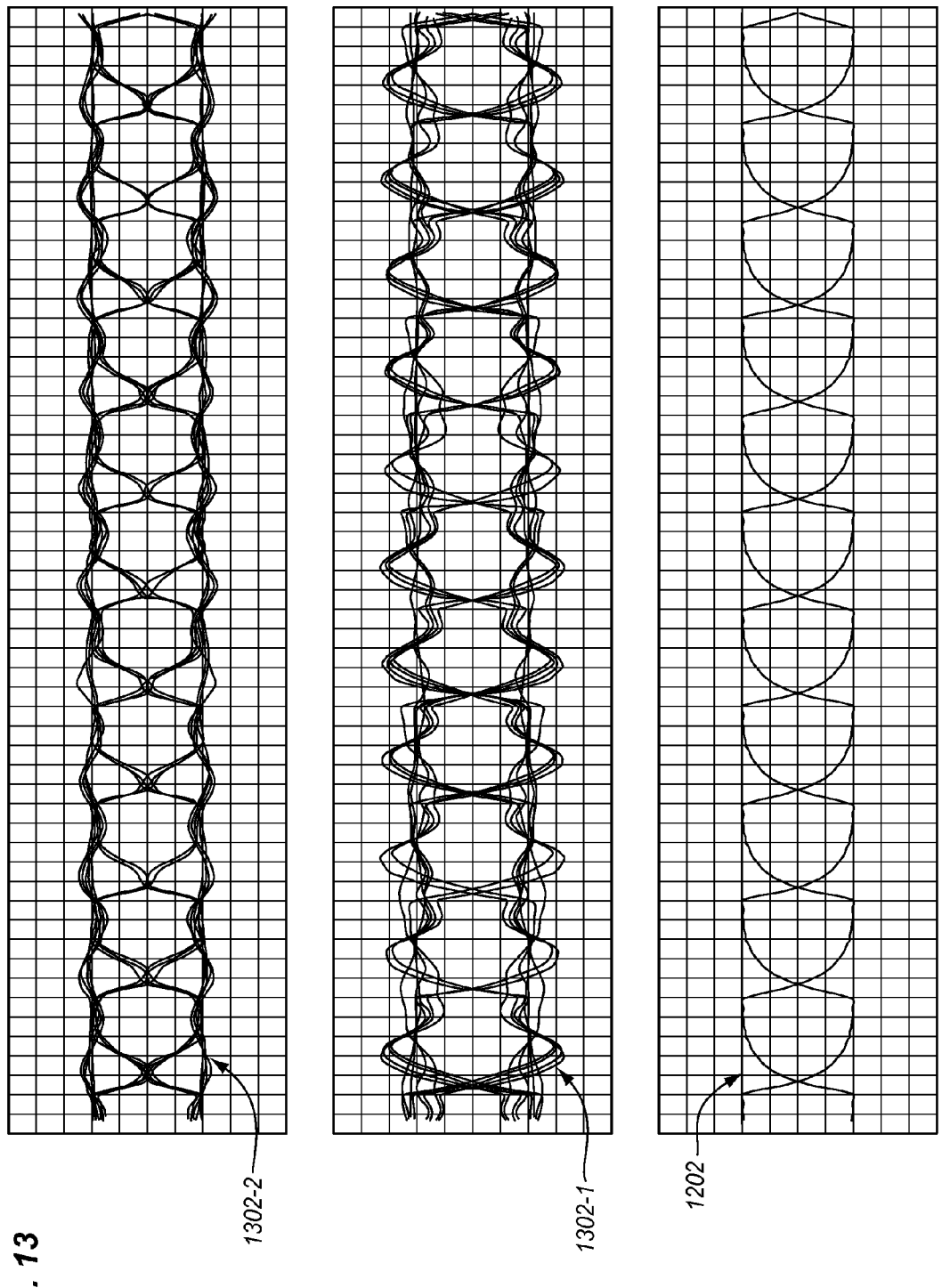

FIG. 13, on the other hand, illustrates the output differential eye patterns 1302-1 and 1302-2 when only the input and output stub lengths 912 and 916 are adjusted to 17 mils and 28 mils, respectively. Although the timing jitter for signal jumping across a ground plane is larger, this situation does yield a larger noise margin for this case. In this situation, it is better to signal jump across a ground plane.

Figure 14:
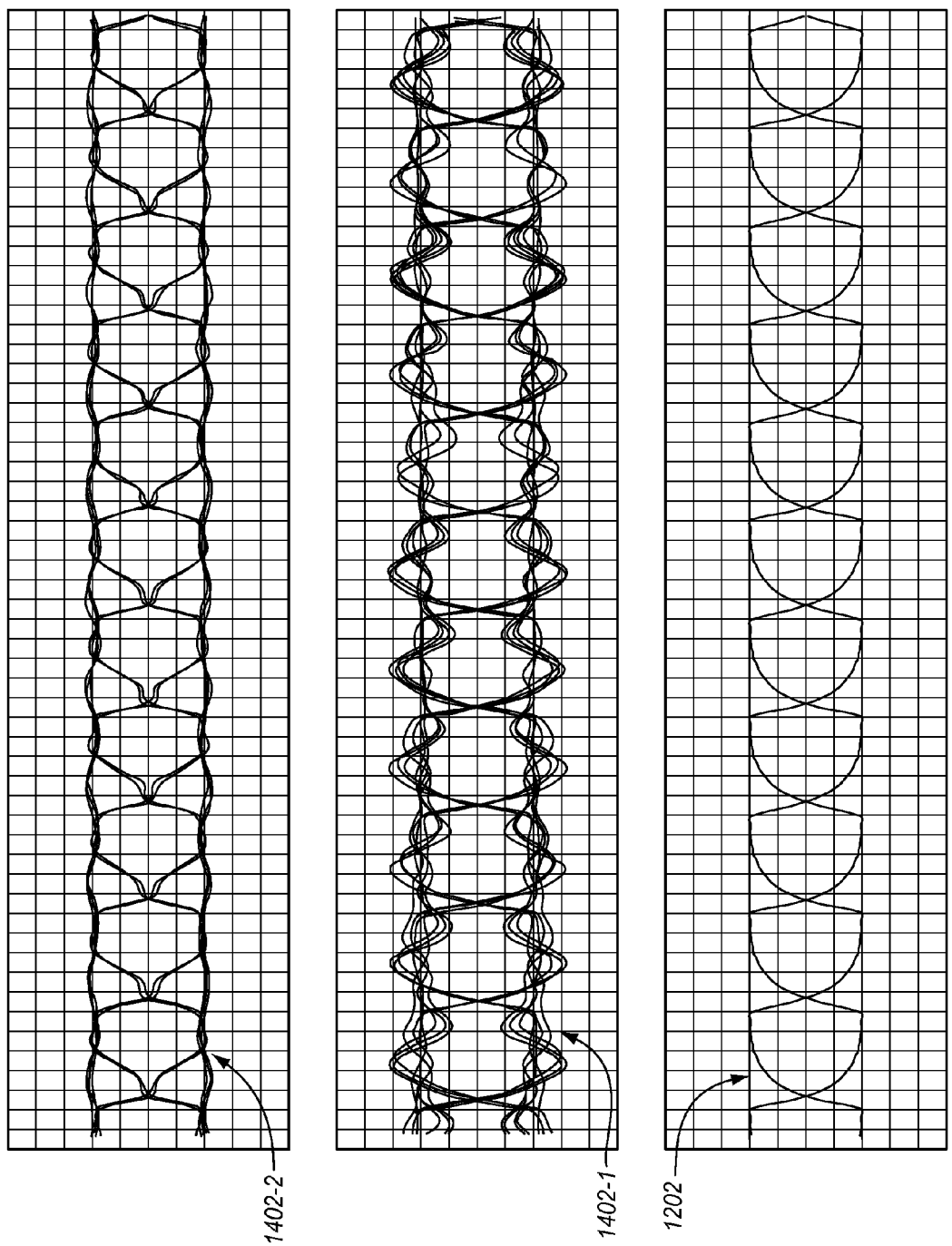

FIG. 14 illustrates the output differential eye patterns 1402-1 and 1402-2 when only the input and output stub lengths 912 and 916 are adjusted to 22 mils and 23 mils, respectively. In this case, it is clear that it is better to signal jump across a reference ground plane, since this situation produces a larger noise margin, as well as smaller timing jitter. FIG. 14 also shows that nearly symmetrical stub lengths are preferred for minimizing the timing jitter, while nearly maintaining the noise margins.

Figure 15:
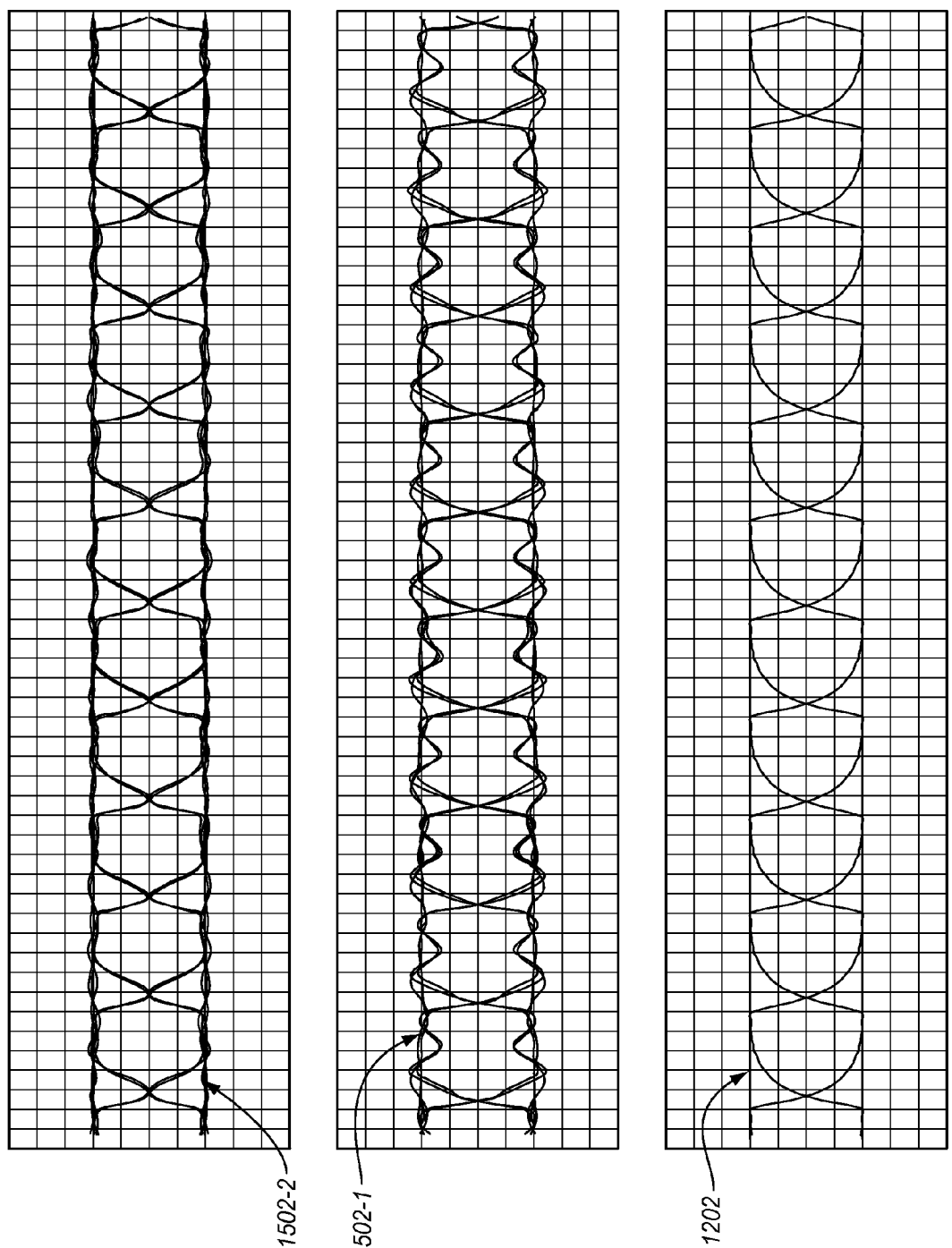

FIG. 15 illustrates the simulation results when only the input and output stub lengths 912 and 916 are each reduced to 16 mils. FIG. 15 demonstrates that 16 mil symmetrical stub lengths produce less timing jitter and larger noise margins for both signal jumping across a reference ground plane (shown in output signal 1502-2), as well as signal jumping across a reference power plane (shown in output signal 1502-1).

FIG. 16 illustrates the simulation results when only the input and output stub lengths 912 and 916 are each reduced to 11 mils. In this situation, the timing jitter is further reduced, while increasing the noise margin when signal jumping across a power plane. However, reducing the symmetrical stub lengths from 16 mils to 11 mils did not improve the output differential eye pattern 1602-2 when signal jumping across a ground plane, making it difficult to extract general trends when signal jumping across a ground plane. However, reducing the symmetrical stub length did improve the output eye pattern 1602-1 when signal jumping across a power plane, because the timing jitter remained negligible, and the noise margin increased in value.

Figure 17:
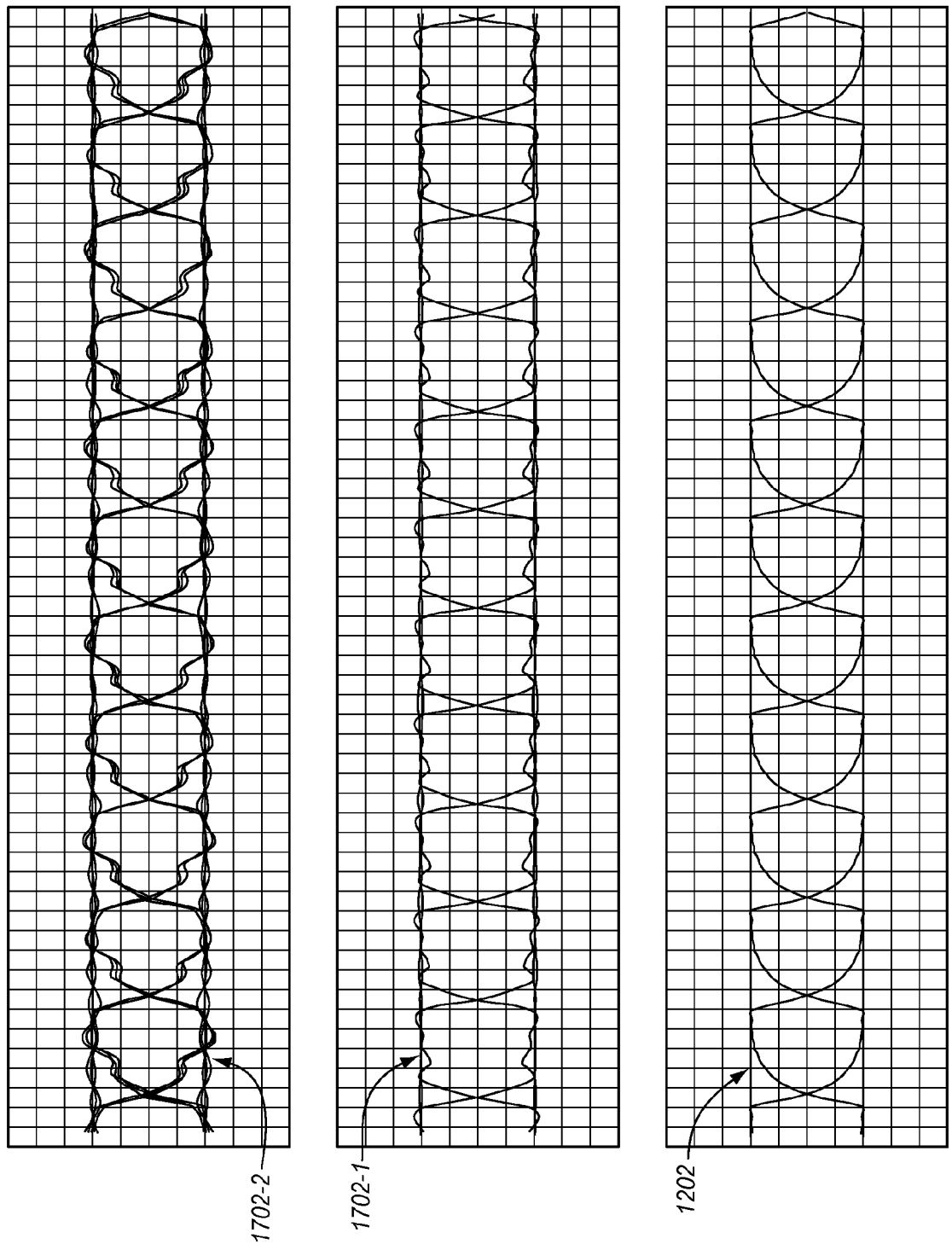

FIG. 17 illustrates output differential eye patterns 1702-1 and 1702-2 when both the input and output stub lengths 912 and 916 remain equal to 11 mils, however, the anti-pad diameter is increased from 40 mils to 90 mils. FIG. 17 shows that although the eye pattern 1702-2 for a signal jumping across a ground plane has improved in its properties, the eye pattern 1702-1 for a signal jumping across a power plane only slightly improved its noise margin. This figure also demonstrates that signals jumping across a power plane can be supported with smaller anti-pad diameters than signal jumping across a ground plane. This result is important when attempting to minimize the printed circuit board area that is used to implement such features.

Figure 18:
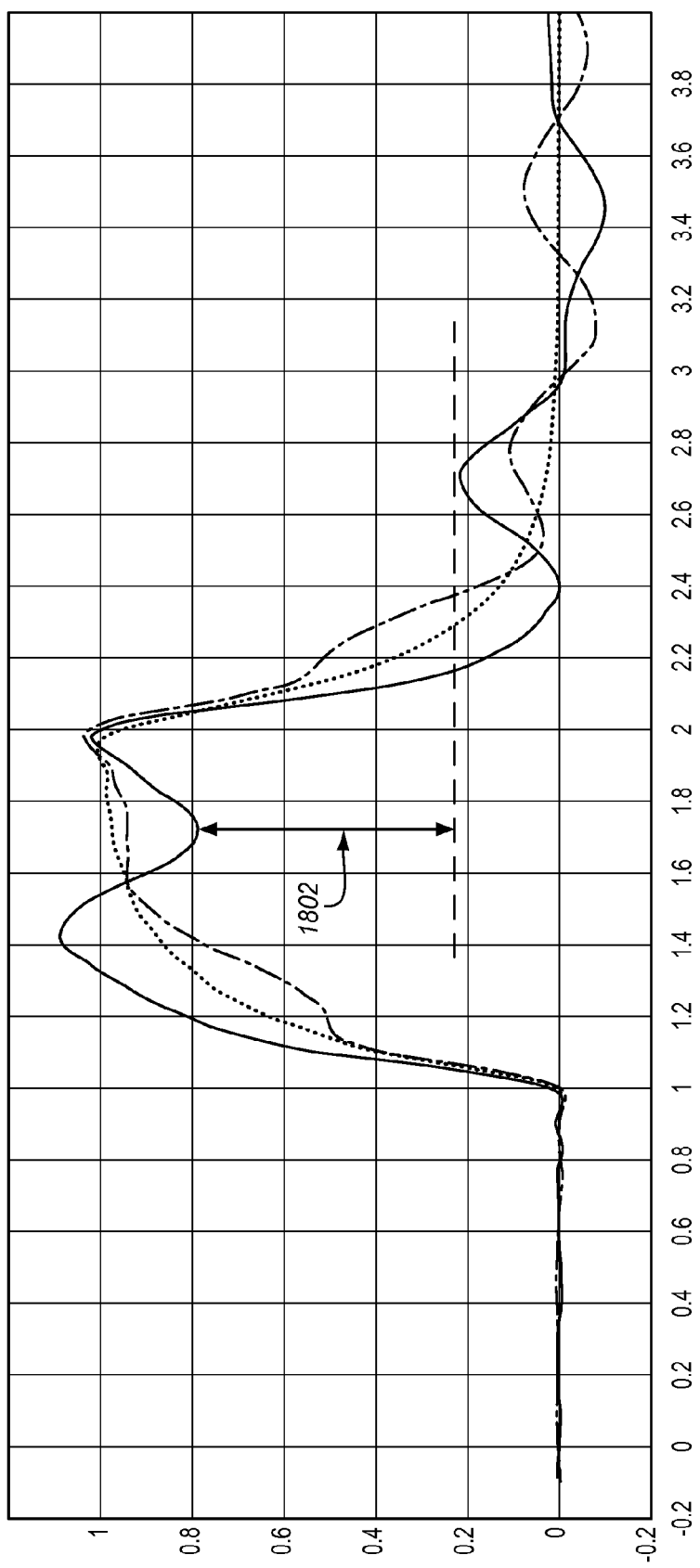
FIGS. 18-19 illustrate the resulting noise margins from the simulations due to a mounting inductance change in exemplary embodiments.
Figure 19:
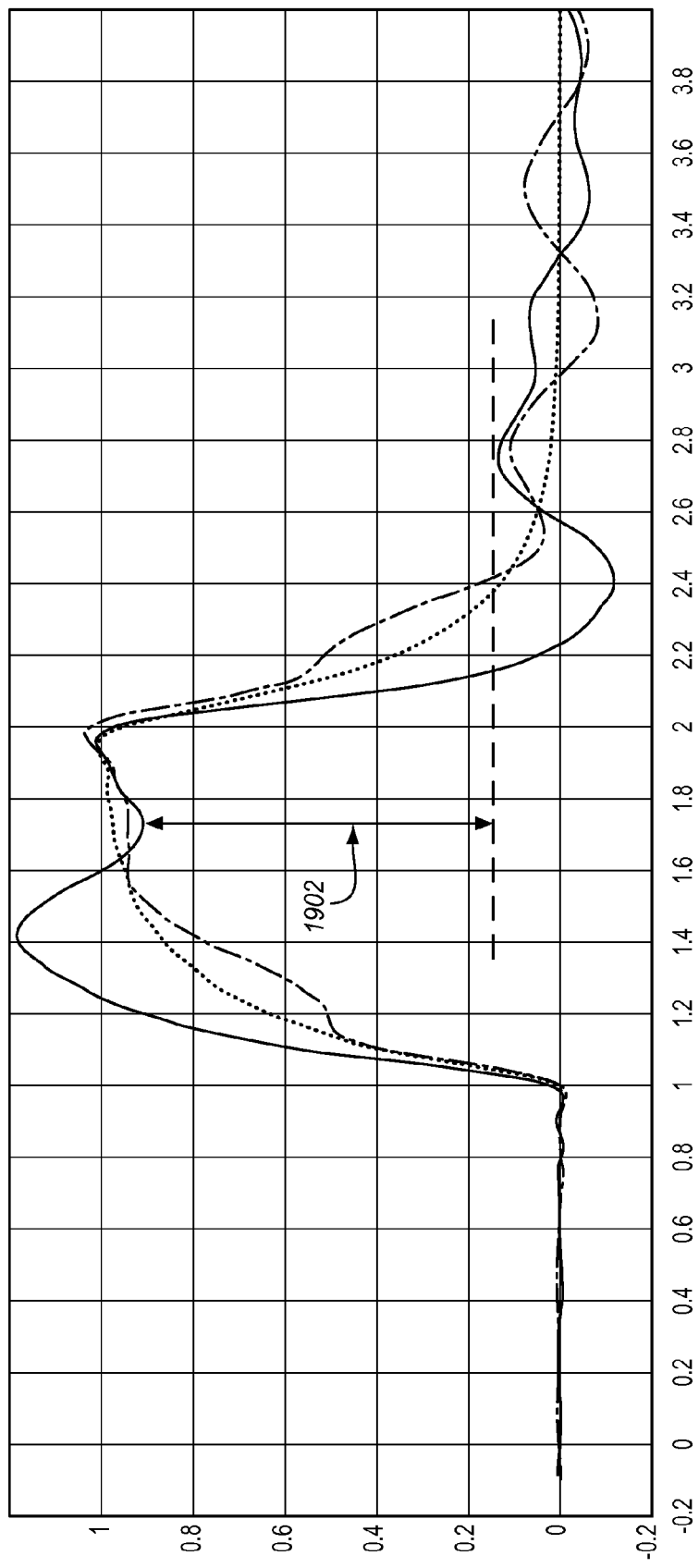

When a signal is jumping across a reference power plane, it was discussed with regard to FIG. 10 that decoupling capacitors 1004 are needed beside each differential via 920. Associated with capacitors 1004, as well as the capacitor's interconnecting vias, is the mounting inductance for capacitors 1004. The mounting inductance is the inductance associated with connecting capacitors 1004 to the printed circuit board, and takes into account the physical size of the capacitor, as well as the two vias 918 and 1006 that connect capacitors 1004 to the power and ground planes. The quality of the output differential eye pattern non-intuitively depends upon this mounting inductance. FIGS. 18-19 illustrate the resulting voltage noise margins from the simulations due to a mounting inductance change in an exemplary embodiment. FIG. 18 illustrates margin 1802 for output 930 when the mounting inductance is 1.3 nH, while FIG. 19 illustrates margin 1902 for output 930 when the mounting inductance is 2.0 nH. In these cases, FIG. 19 shows that margin 1902 is increased as compared to margin 1802.

Figure 20:
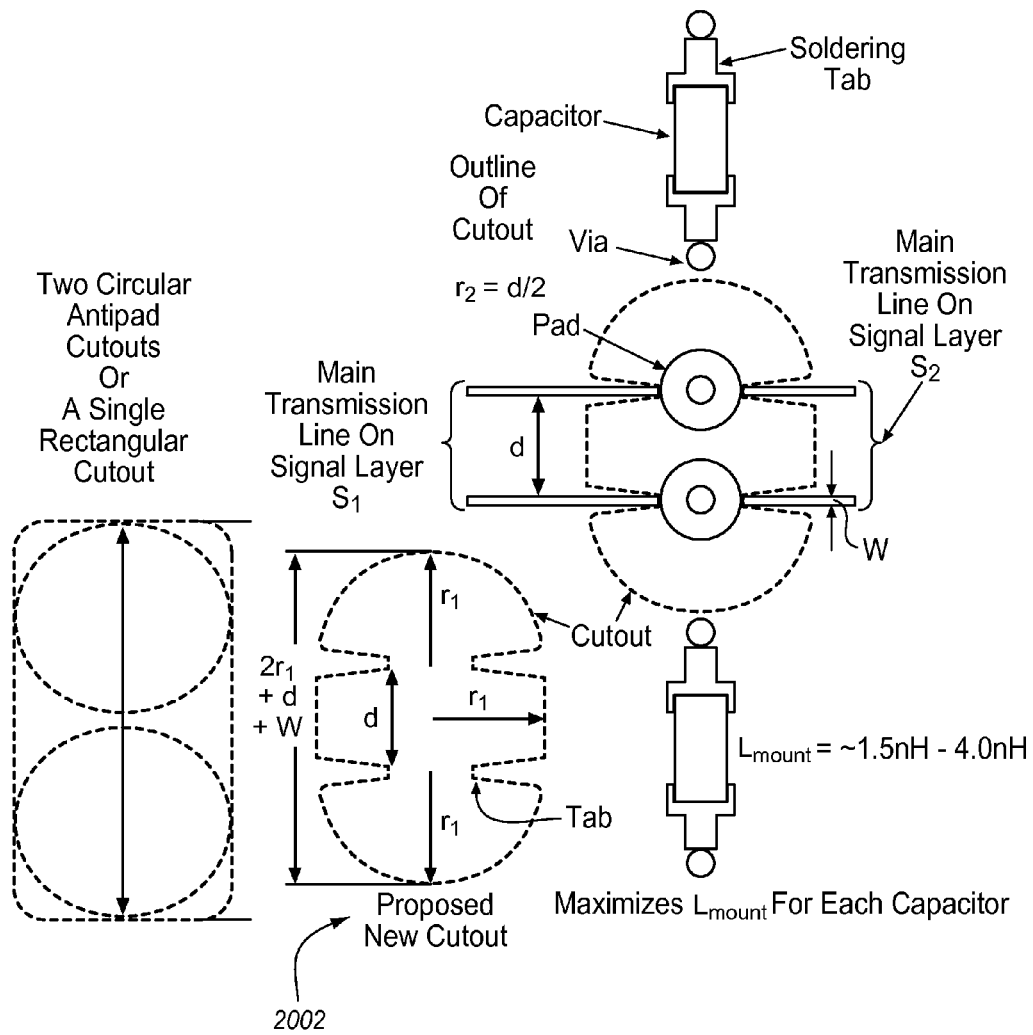
FIG. 20 illustrates a proposed layout to achieve a large mounting inductance in an exemplary embodiment.
Figure 21:
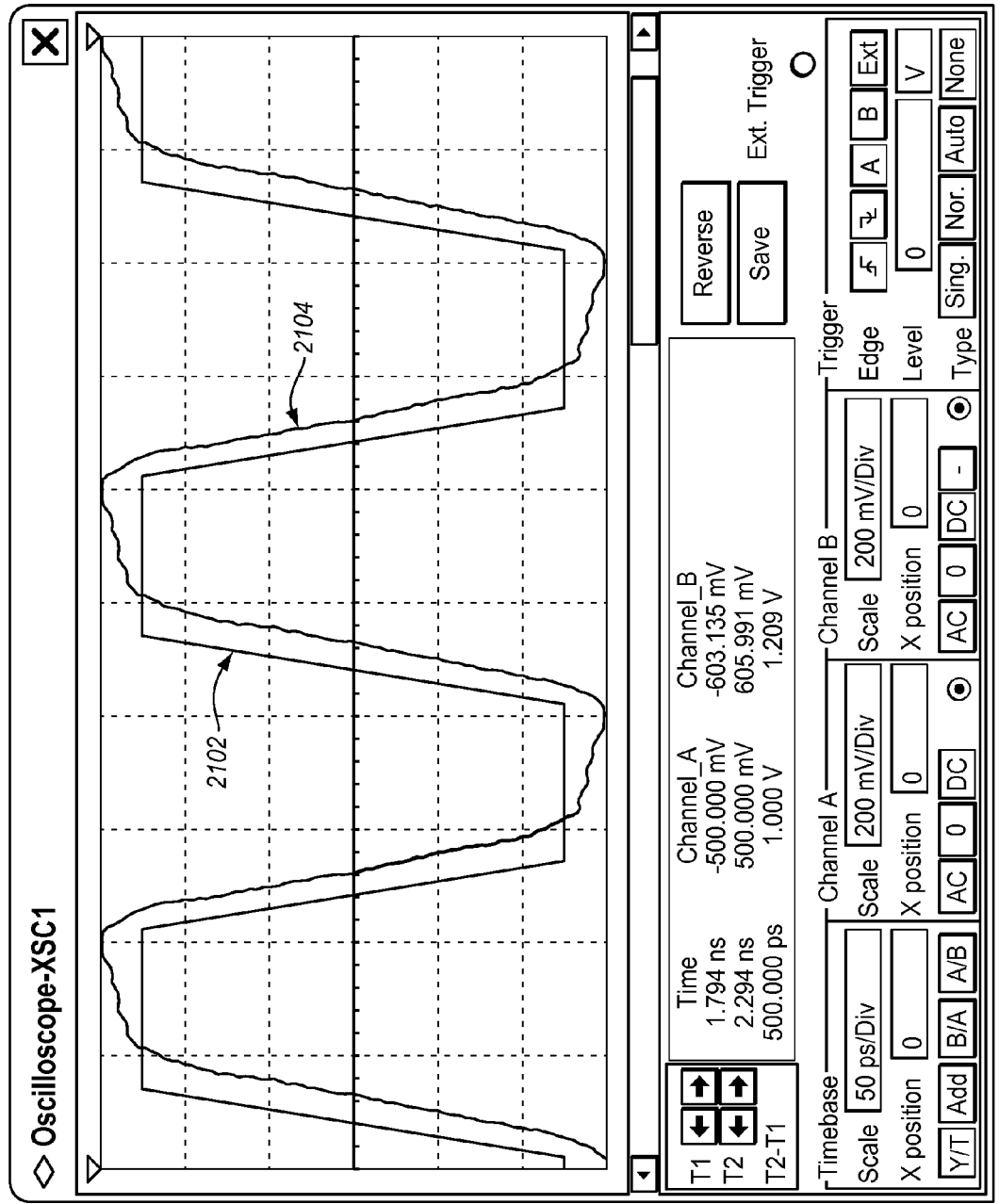
FIGS. 21-23 illustrate the resulting output signals from the simulations due to a change in a decoupling capacitance in exemplary embodiments.
Figure 22:
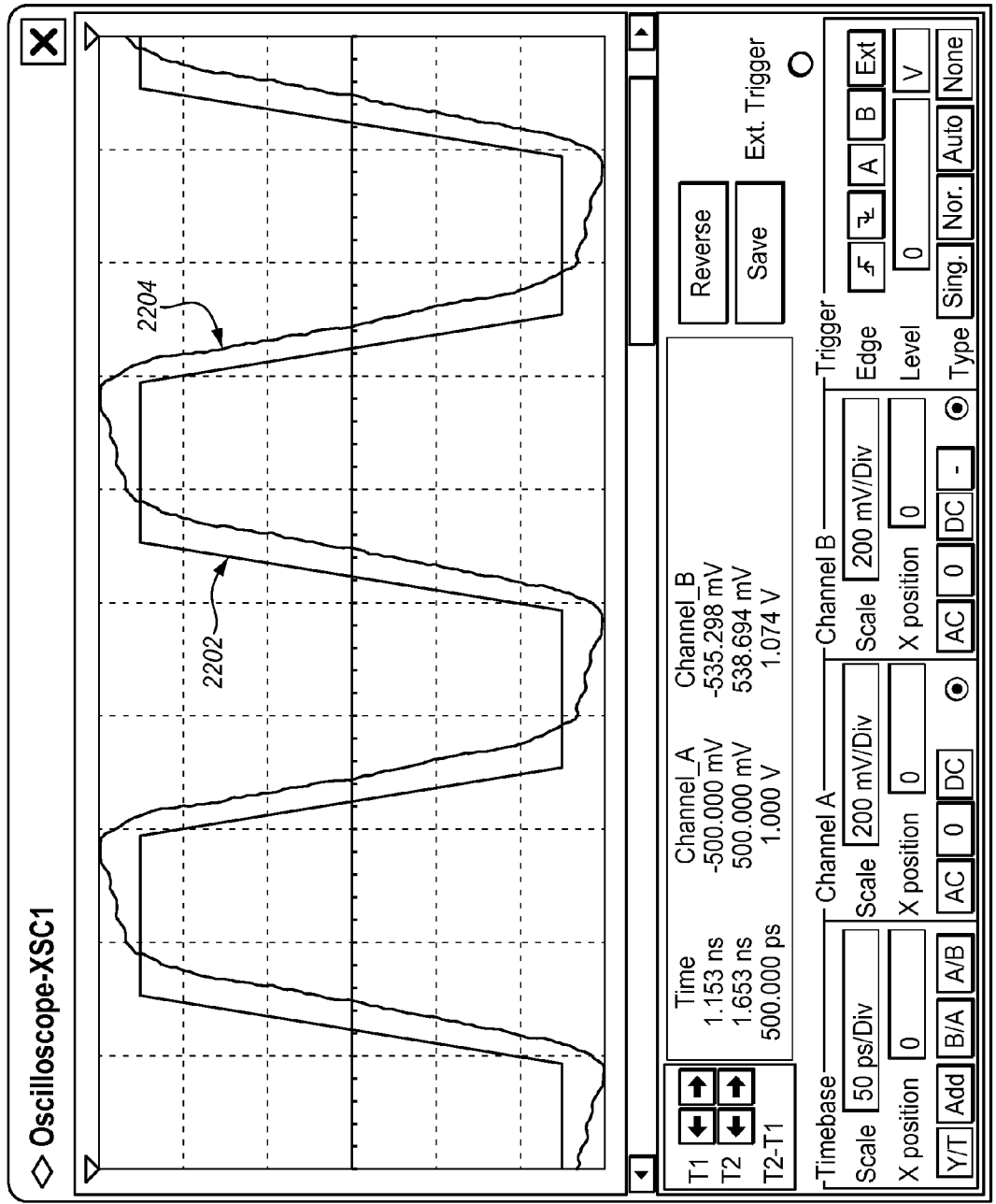
Figure 23:
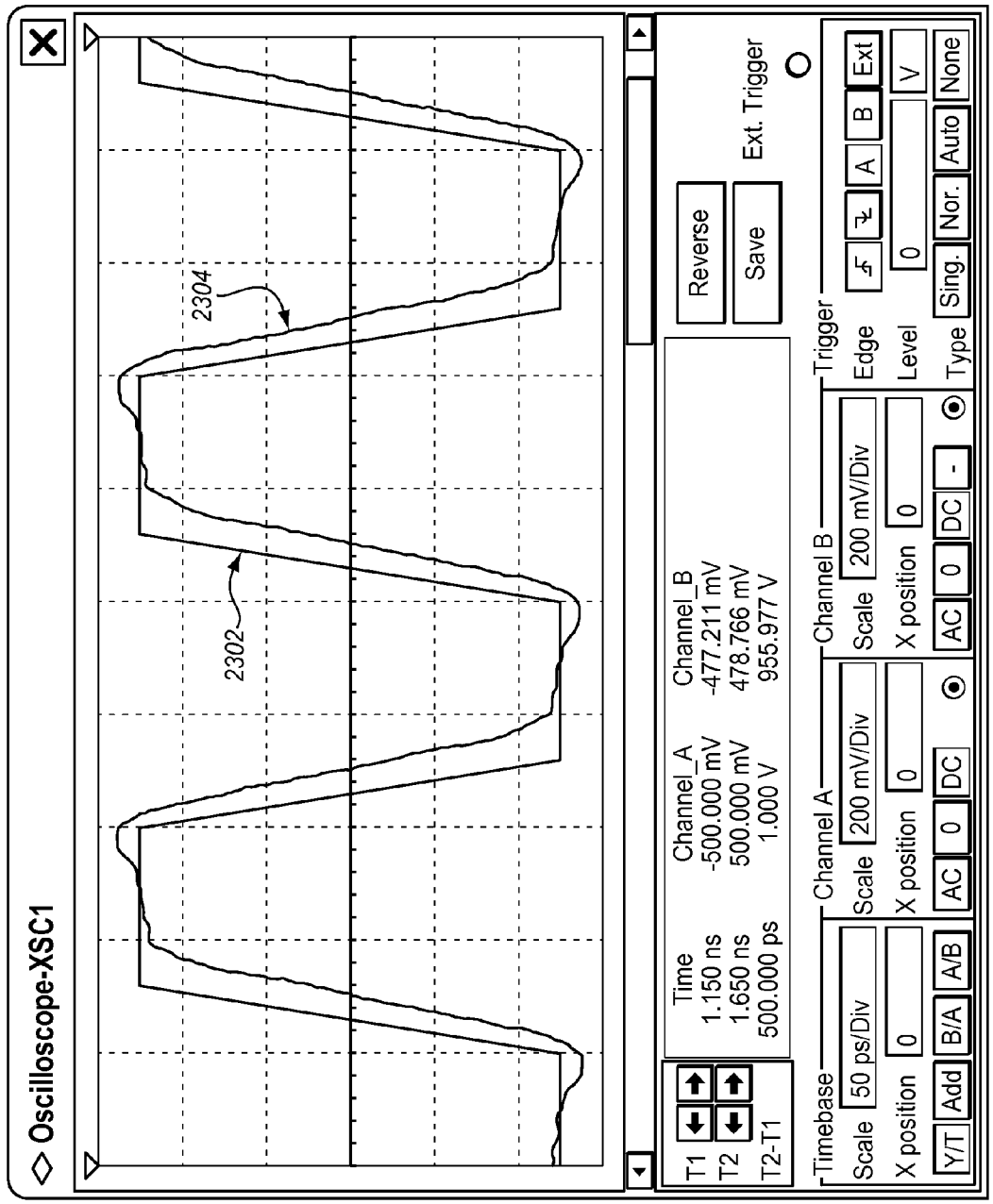
Figure 24:
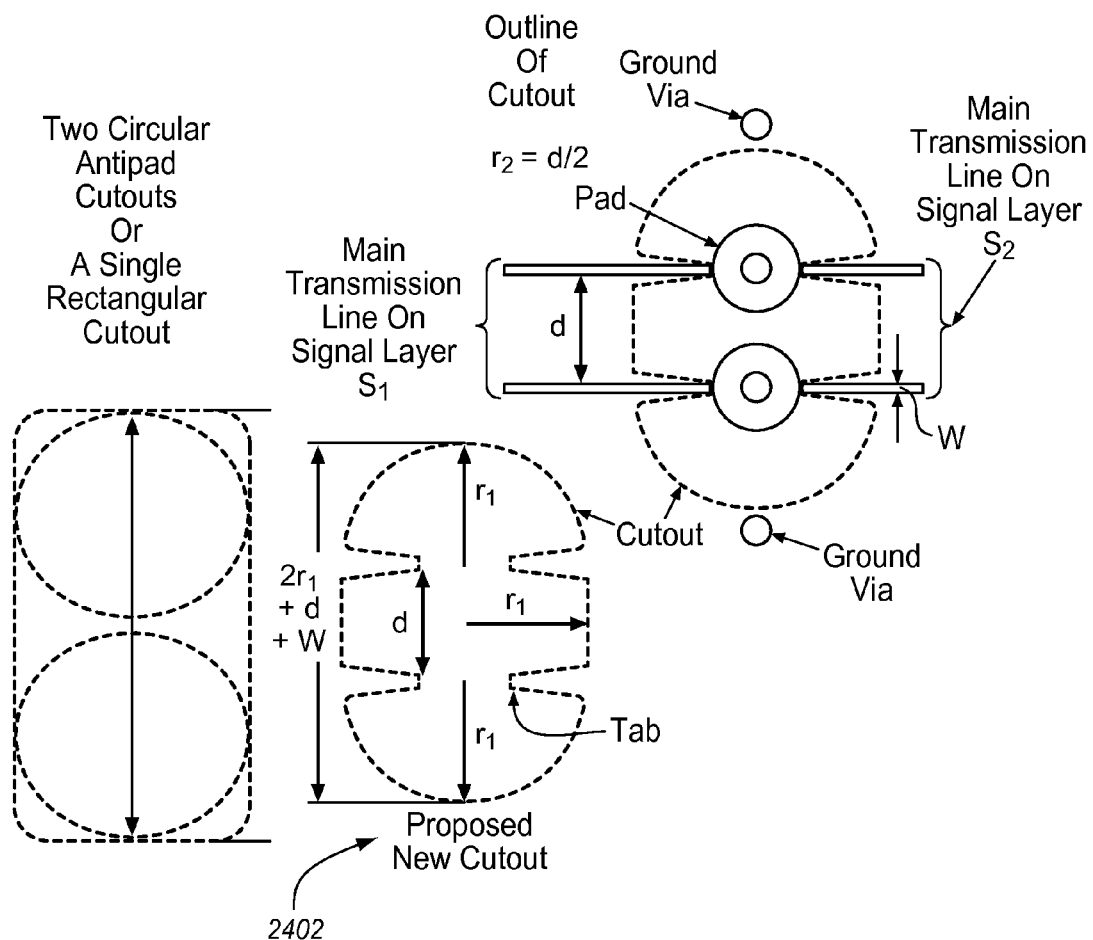
FIG. 24 illustrates a proposed layout when signals cross a ground plane in an exemplary embodiment.

In order to achieve these sizes of mounting inductances, it is important to properly place decoupling capacitors 1004-1 and 1004-2 next to each of differential vias 920-1 and 920-2. FIG. 20 illustrates a proposed layout to achieve a large mounting inductance in an exemplary embodiment. In this case, capacitors 1004-1 and 1004-2 are placed collinearly with differential vias 920-1 and 920-2. This placement approach is utilized in order to achieve the large mounting inductances that yield large voltage noise margins for signals jumping across a power plane. In addition to the placement of capacitors 1004-1 and 1004-2, a proposed anti-pad cutout 2002 is shown in FIG. 20. In this case, the two circular cutouts or single rectangular cutout is replaced by the modified oval cutout, in which the inward tabs are intended to extend the reference plane material either above or below the differential signal conductors residing on signal layers 926 and 930 all the way up to the circular pads. By doing so, the impact of the proposed cutout on the impedance discontinuity induced by this cutout is minimized. In addition, the value of the decoupling capacitors 1004 should be at least 0.01 micro farad. FIGS. 21-23 illustrate the resulting output signals from the simulations due to a change in a decoupling capacitance in an exemplary embodiment. FIG. 21 illustrates the impact of the value of capacitors 1004-1 and 1004-2 on the size of the output signal 2104 as compared to the input signal 2102 when the capacitance is equal to 0.1 micro farad. FIG. 22 illustrates output signal 2204 as compared to input signal 2202 when the value of decoupling capacitors 1004 is reduced to 0.01 micro farad. FIG. 23 shows output signal 2304 as compared to input signal 2302 when the value of decoupling capacitors 1004 is reduced to 1 pF. An appropriate sized capacitor for this application would be an 0603 0.01 micro farad capacitor. FIG. 24 illustrates a proposed layout when signals cross a ground plane in an exemplary embodiment. FIG. 24 illustrates a proposed new cutout 2402 for this case.

Figure 25:
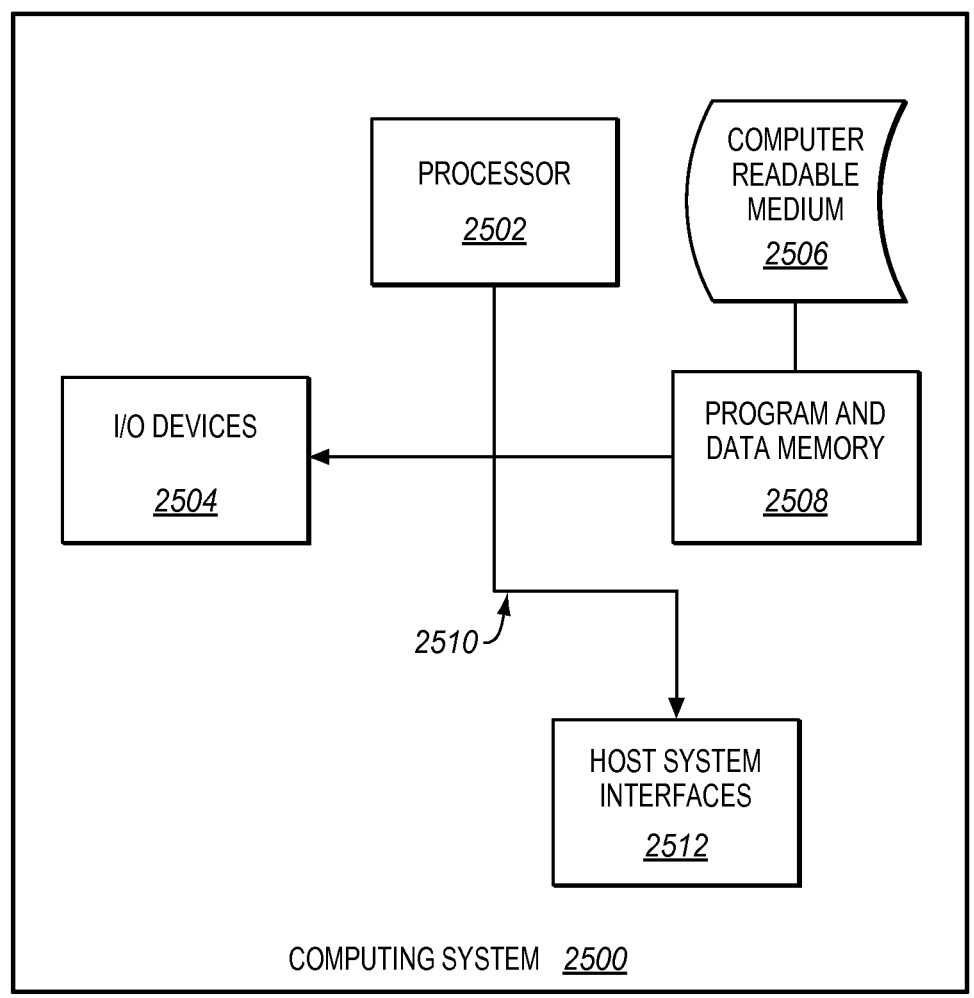
FIG. 25 illustrates a computer system operable to execute computer readable medium embodying programmed instructions to perform desired functions in an exemplary embodiment.

The invention can take the form of an entirely hardware embodiment, an entirely software embodiment or an embodiment containing both hardware and software elements. In one embodiment, the invention is implemented in software, which includes but is not limited to firmware, resident software, microcode, etc. FIG. 25 illustrates a computing system 2500 in which a computer readable medium 2506 may provide instructions for performing methods 100 and 300 in an exemplary embodiment.

Furthermore, the invention can take the form of a computer program product accessible from a computer-usable or computer-readable medium 2506 providing program code for use by or in connection with a computer or any instruction execution system. For the purposes of this description, a computer-usable or computer readable medium 2506 can be any apparatus that can contain, store, communicate, propagate, or transport the program for use by or in connection with the instruction execution system, apparatus, or device.

The medium 2506 can be an electronic, magnetic, optical, electromagnetic, infrared, or semiconductor system (or apparatus or device) or a propagation medium. Examples of a computer-readable medium 2506 include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include one or more processors 2502 coupled directly or indirectly to memory 2508 through a system bus 2510. The memory 2508 can include local memory employed during actual execution of the program code, bulk storage, and cache memories which provide temporary storage of at least some program code in order to reduce the number of times code is retrieved from bulk storage during execution.

Input/output or I/O devices 2504 (including but not limited to keyboards, displays, pointing devices, etc.) can be coupled to the system either directly or through intervening I/O controllers.

Network adapters may also be coupled to the system to enable the data processing system to become coupled to other data processing systems, such a through host systems interfaces 2512, or remote printers or storage devices through intervening private or public networks. Modems, cable modem and Ethernet cards are just a few of the currently available types of network adapters.

Although specific embodiments were described herein, the scope of the invention is not limited to those specific embodiments. The scope of the invention is defined by the following claims and any equivalents thereof.

I claim:

1. A method comprising:
   (a) generating a simulation of a Printed Circuit Board (PCB) via model by:
      representing an input pad coupled with an input stub, wherein the input pad has an input pad diameter value and the input stub has an input stub length value;
      representing an output pad coupled with an output stub, wherein the output pad has an output pad diameter value and the output stub has an output stub length value; and
      representing a transmission line segment coupled with the input pad and the output pad, wherein a signal path is defined from the input pad to the output pad along the transmission line segment;
   (b) generating frequency dependent input impedance values at the input pad based on at least one of the input pad diameter value, the output pad diameter value, the input stub length value, and the output stub length value; and
   (c) estimating a high frequency performance of the via model based on the frequency dependent input impedance values at the input pad by:
      generating a simulated output signal from the output pad by modifying a simulated input signal applied to the input pad based on the input impedance values at the input pad; and determining that the estimated high frequency performance is not acceptable when differences between the output signal and the input signal exceeds a threshold.

2. The method of claim 1 further comprising:
(d) modifying at least one of the input pad diameter value, the output pad diameter value, the input stub length value, and the output stub length value for the model; and
performing steps (a) through (d) until the differences between the output signal and the input signal no longer exceed the threshold.

3. The method of claim 1 wherein the threshold is at least one of a rise time, an undershoot, an overshoot and a timing jitter.

4. The method of claim 1 wherein the transmission line segment traverses a representation of a conductive reference plane, wherein a non-conductive spacing between the transmission line segment and the reference plane defines an anti-pad diameter value, and wherein (b) generating the input impedance values at the input pad further comprises:
generating the input impedance values at the input pad based on the anti-pad diameter value.

5. The method of claim 4 further comprising:
(d) modifying at least one of the input pad diameter value, the output pad diameter value, the input stub length value, the anti-pad diameter and the output stub length value for the model;
performing steps (a) through (d) until the differences between the output signal and the input signal no longer exceed the threshold.

6. The method of claim 4 wherein (b) generating the input impedance values at the input pad further comprises:
calculating a capacitance value for at least one of the input pad and the output pad based on the following equation:

$$C_{pad} = \frac{-4\pi\varepsilon\left(\frac{D_1}{2}\right)\left\{\left(\frac{D_1}{2}\right)^2 + \left[h^2 + \left(\frac{D_2-D_1}{2}\right)^2\right]\right\}^{1/2}}{\left(\frac{D_1}{2}\right) - \left[\left(\frac{D_1}{2}\right)^2 + \left[h^2 + \left(\frac{D_2-D_1}{2}\right)^2\right]\right]^{1/2}} \text{ Farads}$$

where $D_1$ is at least one of the input pad diameter value and the output pad diameter value, $D_2$ is the anti-pad diameter value, and h is a distance between the at least one of the input pad and the output pad and the reference plane.

7. The method of claim 4 wherein the reference plane represents at least one of a ground plane and a power plane.

8. The method of claim 1 wherein the via model represents one of a differential pair of vias, and wherein (b) generating the input impedance values at the input pad further comprises:
generating the input impedance values at the input pad based on one or more coupling paths between the differential pair of vias.

9. The method of claim 1 wherein the input stub length value and the output stub length value are the same value.

10. A non-transitory computer readable medium tangibly embodying programmed instructions which, when executed by processor, are operable for performing a method of optimizing a high frequency performance of a Printed Circuit Board (PCB) via model, the method comprising:
(a) generating a simulation of a Printed Circuit Board (PCB) via model by:
representing an input pad coupled with an input stub, wherein the input pad has an input pad diameter value and the input stub has an input stub length value;
representing an output pad coupled with an output stub, wherein the output pad has an output pad diameter value and the output stub has an output stub length value; and
representing a transmission line segment coupled with the input pad and the output pad, wherein a signal path is defined from the input pad to the output pad along the transmission line segment;
(b) generating frequency dependent input impedance values at the input pad based on at least one of the input pad diameter value, the output pad diameter value, the input stub length value, and the output stub length value; and
(c) estimating a high frequency performance of the via model based on the frequency dependent input impedance values at the input pad by:
generating a simulated output signal from the output pad by modifying a simulated input signal applied to the input pad based on the input impedance values at the input pad; and
determining that the estimated high frequency performance is not acceptable when differences between the output signal and the input signal exceeds a threshold.

11. The non-transitory computer readable medium of claim 10, wherein the method further comprises:
(d) modifying at least one of the input pad diameter value, the output pad diameter value, the input stub length value, and the output stub length value for the model; and
performing method steps (a) through (d) until the differences between the output signal and the input signal no longer exceed the threshold.

12. The non-transitory computer readable medium of claim 11 wherein the threshold is at least one of a rise time, an undershoot, an overshoot, and a timing jitter.

13. The non-transitory computer readable medium of claim 10 wherein the transmission line segment traverses a representation of a conductive reference plane, wherein a non-conductive spacing between the transmission line segment and the reference plane defines an anti-pad diameter value, and wherein the method step (b) generating the input impedance values at the input pad further comprises:
generating the input impedance values at the input pad based on the anti-pad diameter value.

14. The non-transitory computer readable medium of claim 13, wherein the method further comprises:
(d) modifying at least one of the input pad diameter value, the output pad diameter value, the input stub length value, the anti-pad diameter and the output stub length value for the model;
performing method steps (a) through (d) until the differences between the output signal and the input signal no longer exceed the threshold.

15. The non-transitory computer readable medium of claim 13 wherein the method step (b) generating the input impedance values at the input pad further comprises:
calculating a capacitance value for at least one of the input pad and the output pad based on the following equation:

$$C_{pad} = \frac{-4\pi\varepsilon\left(\frac{D_1}{2}\right)\left\{\left(\frac{D_1}{2}\right)^2 + \left[h^2 + \left(\frac{D_2-D_1}{2}\right)^2\right]\right\}^{1/2}}{\left(\frac{D_1}{2}\right) - \left[\left(\frac{D_1}{2}\right)^2 + \left[h^2 + \left(\frac{D_2-D_1}{2}\right)^2\right]\right]^{1/2}} \text{ Farads}$$

where $D_1$ is at least one of the input pad diameter value and the output pad diameter value, $D_2$ is the anti-pad diameter value, and h is a distance between the at least one of the input pad and the output pad and the reference plane.

16. The non-transitory computer readable medium of claim 13 wherein the reference plane represents at least one of a ground plane and a power plane.

17. The non-transitory computer readable medium of claim 10 wherein the via model represents one of a differential pair of vias, and wherein the method step (b) generating the input impedance values further comprises:

generating the input impedance values based on one or more coupling paths between the differential pair of vias.

18. The non-transitory computer readable medium of claim 10 wherein the input stub length value and the output stub length value are the same value.

* * * * *